US012283605B2

(12) United States Patent
An et al.

(10) Patent No.: US 12,283,605 B2
(45) Date of Patent: Apr. 22, 2025

(54) LIGHT-EMITTING ELEMENT, METHOD OF FABRICATING THE LIGHT-EMITTING ELEMENT, AND DISPLAY DEVICE

(71) Applicant: Samsung Display Co., LTD., Yongin-si (KR)

(72) Inventors: Moon Jung An, Hwaseong-si (KR); Hye Lim Kang, Hwaseong-si (KR); Min Young Kim, Cheonan-si (KR); Dong Eon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 694 days.

(21) Appl. No.: 17/382,864

(22) Filed: Jul. 22, 2021

(65) Prior Publication Data
US 2022/0028925 A1 Jan. 27, 2022

(30) Foreign Application Priority Data

Jul. 24, 2020 (KR) ........................ 10-2020-0092312

(51) Int. Cl.
*H10K 59/70* (2023.01)
*H01L 27/15* (2006.01)
(Continued)

(52) U.S. Cl.
CPC ........ *H01L 27/156* (2013.01); *H01L 33/0093* (2020.05); *H01L 33/24* (2013.01);
(Continued)

(58) Field of Classification Search
CPC ..... H01L 2933/0016; H01L 2933/0025; H01L 33/24; H01L 33/38; H01L 33/44;
(Continued)

(56) References Cited

U.S. PATENT DOCUMENTS 8,731,012 B2 * 5/2014 Kondo ................... B82Y 20/00
372/29.013
9,112,112 B2 8/2015 Do et al.
(Continued)

FOREIGN PATENT DOCUMENTS

CN 209804697 12/2019
KR 10-2012-0122159 11/2012
(Continued)

OTHER PUBLICATIONS

International Search Report corresponding to International Application No. PCT/KR2021/009550 dated Nov. 3, 2021.
(Continued)

*Primary Examiner* — Yara B Green
*Assistant Examiner* — Tessa Elizabeth McNamee
(74) *Attorney, Agent, or Firm* — KILE PARK REED & HOUTTEMAN PLLC

(57) ABSTRACT

A light-emitting element, a method of fabricating a light-emitting element, and a display device comprising a light-emitting element are provided. The light-emitting element comprises a first semiconductor layer doped with an n-type dopant, a second semiconductor layer doped with a p-type dopant, a light-emitting layer disposed between the first semiconductor layer and second semiconductor layer, an electrode layer disposed on the second semiconductor layer, an insulating structure disposed on the electrode layer and having a maximum diameter smaller than a diameter of the electrode layer and an insulating film that surrounds side surfaces of the first semiconductor layer, the light-emitting layer, and the second semiconductor layer.

13 Claims, 21 Drawing Sheets

(51) Int. Cl.
*H01L 33/00* (2010.01)
*H01L 33/24* (2010.01)
*H01L 33/38* (2010.01)
*H01L 33/44* (2010.01)

(52) U.S. Cl.
CPC .............. *H01L 33/38* (2013.01); *H01L 33/44* (2013.01); *H01L 2933/0016* (2013.01); *H01L 2933/0025* (2013.01)

(58) Field of Classification Search
CPC ... H01L 33/0093; H01L 27/156; H01L 33/20; H10K 59/70; H10K 59/80515; H10K 59/80521
See application file for complete search history.

(56) References Cited

U.S. PATENT DOCUMENTS

| | | | | |
|---|---|---|---|---|
| 9,202,973 | B2* | 12/2015 | Kim | .......................... H01L 33/08 |
| 2013/0188659 | A1* | 7/2013 | Kondo | ................ H01S 5/18394 |
| | | | | 372/24 |
| 2015/0380459 | A1 | 12/2015 | Bono et al. | |
| 2016/0126419 | A1* | 5/2016 | Kum | ....................... H01L 33/08 |
| | | | | 257/98 |
| 2021/0202450 | A1 | 7/2021 | Min et al. | |
| 2022/0045244 | A1 | 2/2022 | Yoo et al. | |
| 2022/0254959 | A1* | 8/2022 | Lee | ....................... H01L 27/156 |
| 2022/0359783 | A1* | 11/2022 | Kim | ........................ H01L 33/20 |

FOREIGN PATENT DOCUMENTS

| | | |
|---|---|---|
| KR | 10-2020-0029100 | 3/2020 |
| KR | 10-2022-0019902 | 2/2022 |
| KR | 10-2022-0023922 | 3/2022 |
| WO | 2022/035094 | 2/2022 |
| WO | 2022/039417 | 2/2022 |

OTHER PUBLICATIONS

Written Opinion corresponding to International Application No. PCT/KR2021/009550 dated Nov. 3, 2021.

* cited by examiner

LIGHT-EMITTING ELEMENT, METHOD OF FABRICATING THE LIGHT-EMITTING ELEMENT, AND DISPLAY DEVICE

CROSS-REFERENCE TO RELATED APPLICATION(S)

This application claims priority to and the benefit of Korean Patent Application No. 10-2020-0092312 under 35 U.S.C. § 119, filed in the Korean Intellectual Property Office (KIPO) on Jul. 24, 2020, the entire contents of which are incorporated herein by reference.

BACKGROUND

1. Field

The embodiments relate to a light-emitting element, a method of fabricating the light-emitting element, and a display device.

2. Description of the Related Art

Display devices are becoming more important with developments in multimedia technology. Various display devices such as organic light-emitting diode (OLED) display devices, liquid crystal display (LCD) devices, and similar devices are used.

A typical display device includes a display panel such as an organic light-emitting display panel or a liquid crystal display (LCD) panel. A light-emitting display panel may include light-emitting elements. For example, light-emitting diodes (LEDs) include organic light-emitting diodes (OLEDs) using an organic material as a fluorescent material and inorganic LEDs using an inorganic material as a fluorescent material.

SUMMARY

The embodiments provide a light-emitting element capable of minimizing damage to an electrode layer and a method of fabricating the light-emitting element.

The embodiments also provide a display device having an improved luminance by including a light-emitting element capable of minimizing damage to an electrode layer.

However, the embodiments are not restricted to those set forth herein. The above and other embodiments will become more apparent to one of ordinary skill in the art to which the disclosure pertains by referencing the detailed description of the disclosure given below.

According to an embodiment, a light-emitting element may include a first semiconductor layer doped with an n-type dopant, a second semiconductor layer doped with a p-type dopant, a light-emitting layer disposed between the first semiconductor layer and the second semiconductor layer, an electrode layer disposed on the second semiconductor layer, an insulating structure disposed on the electrode layer and having a maximum diameter smaller than a diameter of the electrode layer and an insulating film that surrounds side surfaces of the first semiconductor layer, the light-emitting layer, and the second semiconductor layer.

The insulating structure may include a bottom surface that contacts the electrode layer, and an inclined side surface that is inclined with respect to the bottom surface. A diameter of the insulating structure may decrease from the bottom surface to a top of the insulating structure.

A height of the insulating structure may be in a range of about 500 nm to about 1 μm.

A maximum diameter of the insulating structure may be in a range of about 100 nm to about 500 nm.

The insulating structure may include a first portion and a second portion. The first portion may have a maximum width of the insulating structure and the first portion may include a side surface that is inclined. The second portion may be connected to a lower part of the first portion and have a smaller width than the maximum width of the insulating structure.

The insulating structure may include at least one of silicon oxide, silicon nitride, and silicon oxynitride, and the insulating film may be a single layer or a multilayer including at least one of silicon oxide, silicon nitride, silicon oxynitride, aluminum nitride, aluminum oxide, titanium oxide, zirconium oxide, and hafnium oxide.

A thickness of the insulating film may be in a range of about 10 nm to about 200 nm.

The light-emitting element may further comprise a third semiconductor layer disposed between the first semiconductor layer and the light-emitting layer, a fourth semiconductor layer disposed between the second semiconductor layer and the light-emitting layer, and a fifth semiconductor layer disposed between the second and fourth semiconductor layers, wherein the insulating film may surround the side surfaces of the third, fourth, and fifth semiconductor layers.

According to an embodiment, a method of fabricating a light-emitting element may include forming a semiconductor structure on a target substrate, the semiconductor structure including semiconductor layers; forming a mask layer on the semiconductor structure; and etching the semiconductor structure in a direction perpendicular to a top surface of the target substrate to form element rods, each of the element rods including an insulating structure and the semiconductor layers, the insulating structure being formed by a part of the mask layer; forming insulating films surrounding parts of side surfaces of the element rods; and separating the element rods with the insulating films from the target substrate.

The forming of the mask layer may include forming an insulating mask layer on the semiconductor structure; and forming a metal pattern layer on the insulating mask layer, the metal pattern including patterns spaced apart from one another, and the insulating structure may be formed by etching the insulating mask layer.

The forming the element rods may comprise performing a first etching step and performing a second etching step. The first etching step may include etching the insulating mask layer along the metal pattern layer to form a hard mask layer and etching the semiconductor structure along the hard mask layer. The second etching step may include etching the etched semiconductor structure etched along the hard mask layer to form the element rods including the insulating structure.

The first etching step may include a dry etching process, and the second etching step may include a wet etching process.

The semiconductor structure may be etched to have a side surface that is exposed and inclined, and the semiconductor layers of the element rods may be formed to have side surfaces that are perpendicular to the target substrate.

The forming of the element rods may include forming a first semiconductor layer doped with an n-type dopant; a second semiconductor layer doped with a p-type dopant; a light-emitting layer disposed between the first and second semiconductor layers; and an electrode layer disposed on the second semiconductor layer. The insulating structures may be formed on the electrode layer, and the insulating films may be formed to surround side surfaces of the first semiconductor, the light-emitting layer, the second semiconductor layer, and the electrode layer.

The insulating structure may be formed to have an inclined surface such that a diameter of the insulating structure decreases from a bottom surface to a top of the insulating structure.

According to an embodiment, a display device may include a first substrate, a first electrode disposed on the first substrate, a second electrode spaced apart from the first electrode, a first insulating layer disposed on the first substrate and covering the first electrode and the second electrode, a plurality of light-emitting elements disposed on the first insulating layer and including end portions disposed on the first electrode and the second electrode, a first contact electrode that electrically contacts the first electrode and first end portions of the plurality of light-emitting elements and a second contact electrode that electrically contacts the second electrode and with second end portions of the plurality of light-emitting elements. Each of the plurality of light-emitting elements includes a first semiconductor layer doped with an n-type dopant, a second semiconductor layer doped with a p-type dopant, a light-emitting layer disposed between the first and second semiconductor layers, an electrode layer disposed on the second semiconductor layer, an insulating structure disposed on the electrode layer and having a maximum diameter smaller than a diameter of the electrode layer, and an insulating film that surrounds side surfaces of the first semiconductor layer, the light-emitting layer, and the second semiconductor layer.

The insulating structure may include a bottom surface and an inclined side surface, and a diameter of the insulating structure may decrease from the bottom surface to a top of the insulating structure.

The insulating structure may include at least one of silicon oxide, silicon nitride, and silicon oxynitride.

The display device may further comprise a first contact surface where the first contact electrode and part of a top surface of the electrode layer contact each other, a second contact surface where the first contact electrode and a part of a side surface of the insulating structure contact each other, and a third contact surface where the second contact electrode and a bottom surface of the first semiconductor layer contact each other, wherein the first contact surface may be smaller than the third contact surface.

A space may be formed between the insulating structure of each of the plurality of light-emitting elements and the first insulating layer, and the electrode layer may include a surface that adjoins the space and does not contact the first contact electrode.

According to the aforementioned and other embodiments, a light-emitting element may include an insulating structure, which is formed by a remaining part of a mask layer during the fabrication of the light-emitting element. Since a chemical treatment process for removing the insulating structure is not needed, damage to an electrode layer can be minimized, and the emission efficiency and the luminance of the light-emitting element can be improved.

Also, as the light-emitting element is included in a display device, the amount of light emitted from each subpixel of the display device can be increased.

Other features and embodiments may be apparent from the following detailed description, the drawings, and the claims.

BRIEF DESCRIPTION OF THE DRAWINGS

The above and other embodiments and features will become more apparent by describing in detail embodiments thereof with reference to the attached drawings, in which.

DETAILED DESCRIPTION OF THE EMBODIMENTS

Figure 1:
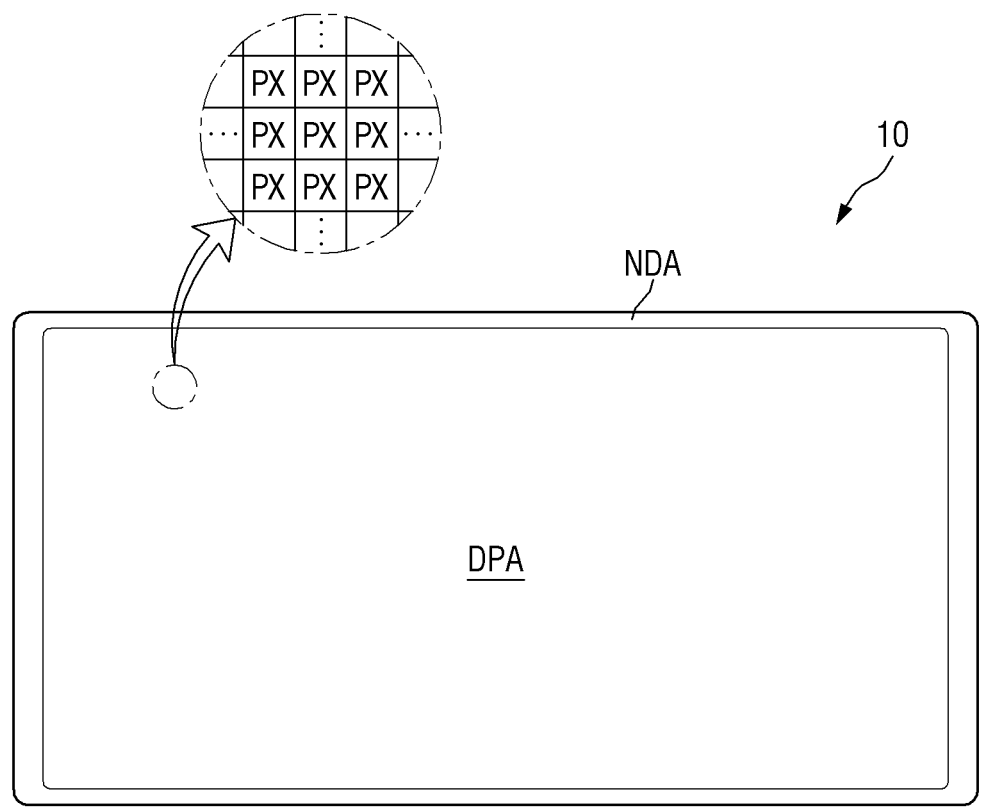
FIG. 1 is a schematic plan view of a display device according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The drawings and description are to be regarded as only illustrative in nature, and thus are not limiting of embodiments described and claimed herein. Some of the parts which are not associated with the description may not be provided in order to describe embodiments of the invention and like reference numerals refer to like elements throughout the specification.

In the drawings, a size and thickness of each element are arbitrarily represented for better understanding and ease of description, however the invention is not limited thereto. In the drawings, the thickness of layers, films, panels, regions, and other elements may be exaggerated for clarity. In the drawings, for better understanding and ease of description, the thicknesses of some layers and areas may be exaggerated.

In the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below a second object, and vice versa.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Throughout the specification, when an element is referred to as being "connected" to another element, the element may be "directly connected" to another element, or "electrically connected" to another element with one or more intervening elements interposed therebetween.

As used herein, the term "and/or" includes any and all combinations of one or more of the associated listed items. In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a display device, a light emitting element and a method of fabricating the light emitting element according to the embodiments will be described with reference to the accompanying drawings.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the embodiments are not limited thereto. Various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends longer in the horizontal direction (first direction DR1) than in the vertical direction (second direction DR2).

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include multiple pixels PX. The pixels PX may be arranged in row and column directions. The pixels PX may have a rectangular or square shape in a plan view, but the embodiments are not limited thereto. The pixels PX may have a rhombus shape having sides that are inclined with respect to a particular direction. The pixels PX may be alternately arranged in a stripe fashion or a pentile fashion. Each of the pixels PX may include one or more light-emitting elements 30, which emit light of a particular wavelength range.

The non-display area NDA may be disposed around the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
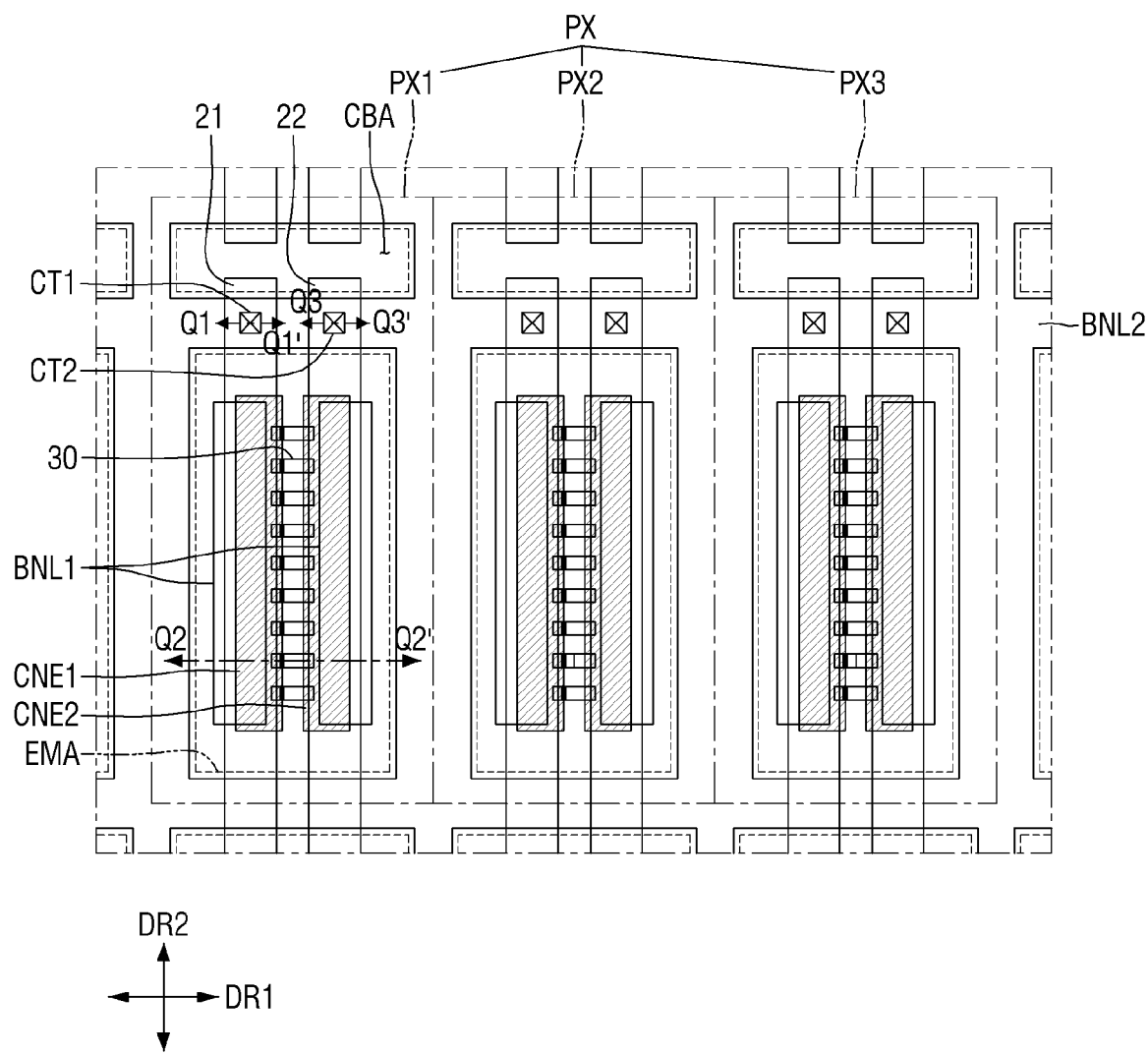
FIG. 2 is a schematic plan view of a pixel of the display device of FIG. 1.

FIG. 2 is a schematic plan view of a pixel of the display device 10 of FIG. 1.

Referring to FIG. 2, a pixel PX may include subpixels PXn (where n is an integer of 1 to 3). For example, the pixel PX may include first, second, and third subpixels PX1, PX2, and PX3. The first, second, and third subpixels PX1, PX2, and PX3 may emit light of first, second, and third colors, respectively. For example, the first, second, and third colors may be blue, green, and red, respectively, but the embodiments are not limited thereto. In another example, the first, second, and third subpixels PX1, PX2, and PX3 may emit light of the same color. FIG. 2 illustrates that the pixel PX includes three subpixels PXn, but the embodiments are not limited by the number of subpixels PXn, and pixel PX may include more than three subpixels PXn.

Each of the subpixels PXn may include an emission area EMA and a non-emission area. The emission area EMA may be an area in which light-emitting elements 30 are disposed to emit light of a particular wavelength range, and the non-emission area may be an area from which no light is output due to the absence of the light-emitting elements 30. The emission area EMA may include regions where the light-emitting elements 30 are disposed and regions around the light-emitting elements 30 that light emitted by the light-emitting elements 30 is output from.

However, the embodiments are not limited thereto. The emission area EMA may also include regions that light emitted by the light-emitting elements 30 and then reflected or refracted by other members is output from. Multiple light-emitting elements 30 may be disposed in each of the subpixels PX to form the emission area EMA.

Each of the subpixels PXn may further include a cut area CBA, which is disposed in the non-emission area. The cut area CBA may be disposed on one side, in the second direction DR2, of the emission area EMA. The cut area CBA may be disposed between emission areas EMA of two subpixels PXn that are adjacent to each other in the second direction DR2. Emission areas EMA and cut areas CBA may be arranged in the display area DPA of the display device 10. For example, emission areas EMA may be arranged in rows in the first direction DR1, cut areas CBA may be arranged in rows in the first direction DR1, and the emission areas EMA and the cut areas CBA may be alternately arranged in the second direction DR2. The distance, in the first direction DR1, between the cut areas CBA may be smaller than the distance, in the first direction DR1, of the emission areas EMA. A second bank BNL2 may be disposed between the cut areas CBA and the emission areas EMA, and the distances between the cut areas CBA, between the emission areas EMA, and between the cut areas CBA and the emission areas EMA may vary depending on the width of the second bank BNL2. As the light-emitting elements 30 are not disposed in the cut area CBA of each of the subpixels PXn, no light is output from the cut area CBA of each of the subpixels PXn. Instead, parts of electrodes (21 and 22) may be disposed in the cut area CBA of each of the subpixels PXn. The electrodes (21 and 22) may be divided in the cut area CBA of each of the subpixels PXn.

Figure 3:
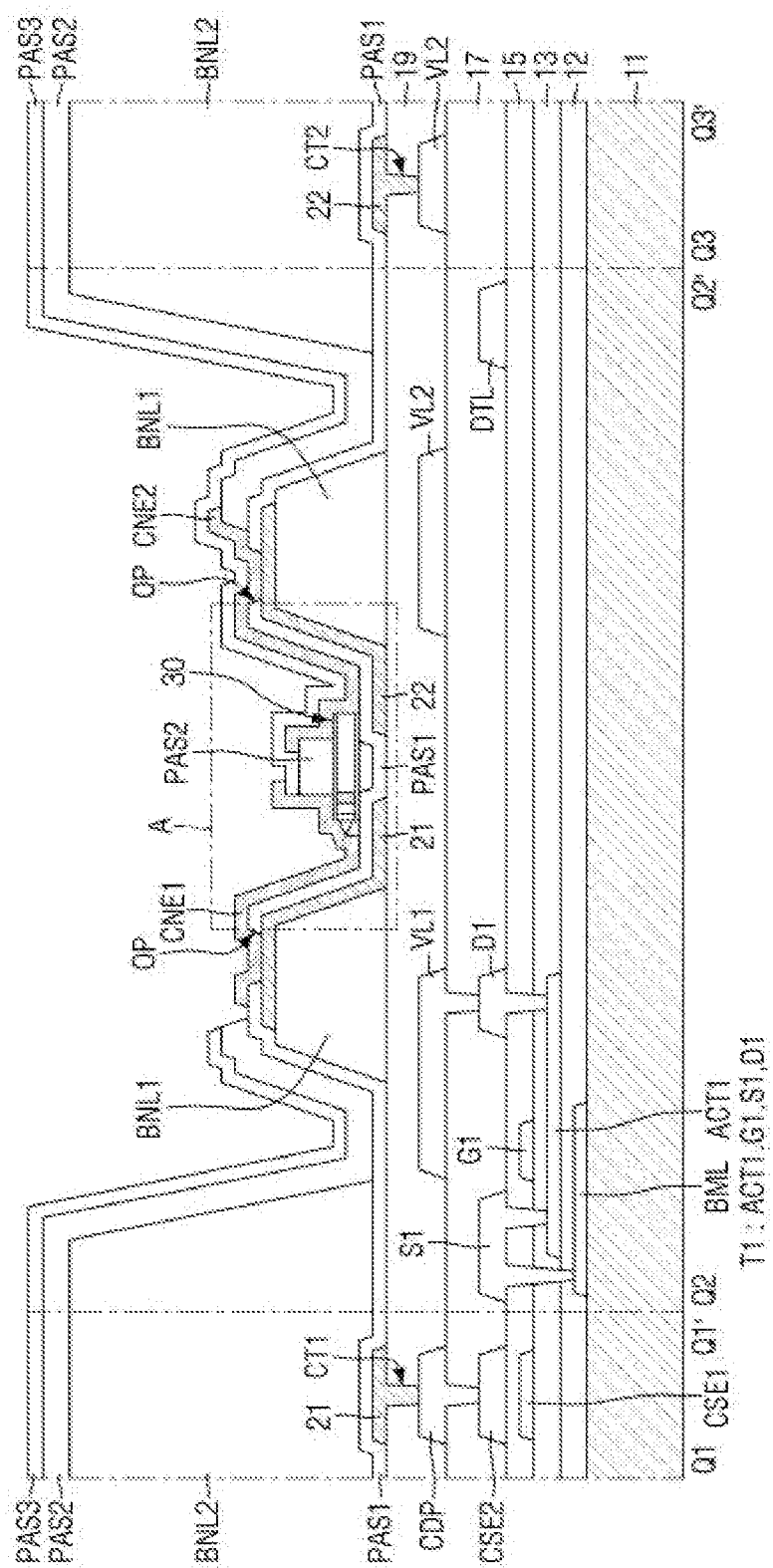
FIG. 3 is a schematic cross-sectional view taken along lines Q1-Q1', Q2-Q2', and Q3-Q3' of FIG. 2.

FIG. 3 is a cross-sectional view taken along lines Q1-Q1', Q2-Q2', and Q3-Q3' of FIG. 2. FIG. 3 illustrates a cross-sectional view taken from one end to the other end of a light-emitting elements 30 in the first subpixel PX1 of FIG. 2.

Referring to FIG. 3 and to FIG. 2, the display device 10 may include a first substrate 11 and a semiconductor layer, multiple conductive layers, and multiple insulating layers, which are disposed on the first substrate 11. The semiconductor layer, the conductive layers, and the insulating layers may form a circuit layer and a light-emitting layer of the display device 10.

The first substrate 11 may be an insulating substrate. The first substrate 11 may be formed of an insulating material such as glass, quartz, or a polymer resin. The first substrate 11 may be a rigid substrate or a flexible substrate that is bendable, foldable, or rollable.

A light-blocking layer BML may be disposed on the first substrate 11. The light-blocking layer BML is disposed to overlap with an active layer ACT1 of a first transistor T1. The light-blocking layer BML includes a material capable of blocking light and can thus prevent light from being incident upon the active layer ACT1 of the first transistor T1. For example, the light-blocking layer BML may be formed of an opaque metallic material capable of blocking the transmission of light, but the embodiments are not limited thereto. In some embodiments, the light-blocking layer BML may not be provided.

A buffer layer 12 may be disposed on the entire surface of the first substrate 11. For example, the buffer layer 12 may be disposed to cover the top surface of the first substrate 11. The buffer layer 12 may be formed on the first substrate to protect the first transistor T1 (for example, protect the transistors from moisture) and may perform a surface planarization function.

The active layer ACT1 may be disposed on the buffer layer 12. The active layer ACT1 may be disposed to overlap in part with a gate electrode G1 of a first conductive layer that will be described below.

FIG. 3 illustrates only the first transistor T1 among the transistors included in the first subpixel PX1, but the embodiments are not limited thereto. The display device 10 may include more than one transistor in each of the subpixels PXn. For example, the display device 10 may include two or three transistors in each of the subpixels PXn.

The active layer ACT1 may include polycrystalline silicon, monocrystalline silicon, or an oxide semiconductor. In a case where the active layer ACT1 includes an oxide semiconductor, the active layer ACT1 may include multiple conductor regions and a channel region disposed between the conductor regions. The oxide semiconductor may contain indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

In other embodiments, the active layer ACT1 may include polycrystalline silicon, which may be formed by crystallizing amorphous silicon. In this case, the conductor regions of the active layer ACT1 may be impurity-doped regions.

A first gate insulating layer 13 may be disposed on the active layer ACT1 and the buffer layer 12. For example, the first gate insulating layer 13 may be disposed to cover the entire surface of the active layer ACT1 and the buffer layer 12. The first gate insulating layer 13 may function as a gate insulating film for each transistor.

The first conductive layer is disposed on the first gate insulating layer 13. A first conductive layer may include the gate electrode G1 of the first transistor T1 and a first capacitive electrode CSE1 of a storage capacitor. The gate electrode G1 may be disposed to overlap with the channel region of the active layer ACT1 in a thickness direction, which may be a normal direction from the plane defined by first direction DR1 and second direction DR2 and extending from the bottom of FIG. 3 to the top of FIG. 3. The first capacitive electrode CSE1 may be disposed to overlap with a second capacitive electrode CSE2 that will be described below, in the thickness direction. For example, the first capacitive electrode CSE1 may be integrally formed with, and electrically connected to, the gate electrode G1. The first capacitive electrode CSE1 may be disposed to overlap with the second capacitive electrode CSE2 in the thickness direction, and a storage capacitor may be formed between the first and second capacitive electrodes CSE1 and CSE2.

The first interlayer insulating layer 15 may be disposed on the first conductive layer. The first interlayer insulating layer 15 may function as an insulating film between the first conductive layer and layers disposed on the first conductive layer. The first interlayer insulating layer 15 may be disposed to cover and protect the first conductive layer.

A second conductive layer may be disposed on the first interlayer insulating layer 15. The second conductive layer may include a first source electrode S1 and a first drain electrode D1 of the first transistor T1, a data line DTL, and the second capacitive electrode CSE2.

The first source electrode S1 and the first drain electrode D1 of the first transistor T1 may be in contact with the doped regions of the active layer ACT1 through contact holes that penetrate the first interlayer insulating layer 15 and the first gate insulating layer 13. The first source electrode S1 of the first transistor T1 may be in contact with the light-blocking layer BML through another contact hole.

The data line DTL may apply a data signal to other transistors (not illustrated) included in the first subpixel PX1. Although not specifically illustrated, the data line DTL may be electrically connected to, and transmit the data signal to, source/drain electrodes of the other electrodes included in the first subpixel PX1.

The second capacitive electrode CSE2 may be disposed to overlap with the first capacitive electrode CSE1 in the thickness direction. For example, the second capacitive electrode CSE2 may be integrally formed with, and electrically connected to, the first source electrode S1.

A second interlayer insulating layer 17 may be disposed on the second conductive layer. The second interlayer insulating layer 17 may function as an insulating film between the second conductive layer and layers disposed on the second conductive layer. The second interlayer insulating layer 17 may cover and protect the second conductive layer.

A third conductive layer is disposed on the second interlayer insulating layer 17. The third conductive layer may include a first voltage line VL1, a second voltage line VL2, and a first conductive pattern CDP. A high-potential voltage (or a first power supply voltage) to be provided to the first transistor T1 may be applied to the first voltage line VL1, and a low-potential voltage (or a second power supply voltage) to be provided to a second electrode 22 may be applied to the second voltage line VL2. Also, an alignment signal for aligning a light-emitting element 30 during the fabrication of the display device 10 may be applied to the second voltage line VL2.

The first conductive pattern CDP may be electrically connected to the second capacitive electrode CSE2 through a contact hole formed in the second interlayer insulating layer 17. The second capacitive electrode CSE2 may be integrally formed with the first source electrode S1 of the first transistor T1, and the first conductive pattern CDP may be electrically connected to the first source electrode S1. The first conductive pattern CDP may be in contact with a first electrode 21 that will be described later, and the first transistor T1 may transmit the first power supply voltage applied from the first voltage line VL1 to the first electrode 21 via the first conductive pattern CDP. The third conductive layer is illustrated as including one first voltage line VL1 and one second voltage line VL2, but the embodiments are not limited thereto. The third conductive layer may include more than one first voltage line VL1 and more than one second voltage line VL2.

Each of the buffer layer 12, the first gate insulating layer 13, the first interlayer insulating layer 15, and the second interlayer insulating layer 17 may consist of multiple inorganic films that are alternately stacked. For example, each of the buffer layer 12, the first gate insulating layer 13, the first interlayer insulating layer 15, and the second interlayer insulating layer 17 may be formed as a double layer or multilayer in which one or more inorganic layers including at least one of silicon oxide ($SiO_x$), silicon nitride ($SiN_x$), and silicon oxynitride ($SiO_xN_y$) are alternately stacked. Each of the buffer layer 12, the first gate insulating layer 13, the first interlayer insulating layer 15, and the second interlayer insulating layer 17 may be formed as a single inorganic layer including at least one of silicon oxide, silicon nitride, and silicon oxynitride.

A first planarization layer 19 is disposed on the third conductive layer. The first planarization layer 19 may include an organic insulating material such as, for example, polyimide (PI), and may perform a surface planarization function.

The first banks BNL1, multiple electrodes (21 and 22), the light-emitting element 30, multiple contact electrodes (CNE1 and CNE2), and a second bank BNL2 are disposed on the first planarization layer 19. Multiple insulating layers (PAS1, PAS2, and PAS3) may also be disposed on the first planarization layer 19.

The first bank BNL1 may be disposed directly on the first planarization layer 19. Referring to FIGS. 2 and 3, the first banks BNL1 may have a predetermined width in each of the subpixels (for example, the first subpixel PX1) and may extend in the second direction DR2. The first banks BNL1 do not extend into neighboring subpixels PXn in the second direction DR2 and may be disposed within the emission area EMA of each subpixel. Also, the first banks BNL1 may be disposed to be spaced apart from each other in the first direction DR1.

Multiple first banks BNL1 may be disposed in each of the subpixels PXn. FIG. 2 illustrates that two first banks BNL1 are disposed in each of the subpixels PXn to form linear patterns in the display area DPA, but the embodiments are not limited thereto. The number of first banks BNL1 provided in each of the subpixels PXn may vary depending on the number of electrodes (21 and 22) and the arrangement of light-emitting elements 30 in each of the subpixels PXn, or the shape of the first banks BNL1 may be modified such that island patterns are formed in the display area DPA.

The first banks BNL1 may protrude at least in part from the top surface of the first planarization layer 19. Each of protruding parts of the first banks BNL1 may have inclined side surfaces, and light emitted from the light-emitting element 30 may be reflected by the electrodes (21 and 22) disposed on the first banks BNL1 to be emitted in an upward direction from the first planarization layer 19. The first banks BNL1 may provide an area in which to arrange the light-emitting element 30 and may function as reflective walls that upwardly reflect light emitted from the light-emitting element 30. The side surfaces of the first banks BNL1 may be linearly inclined (or form a slope), but the embodiments are not limited thereto. The first banks BNL1 may have a semicircular or semielliptical shape with a curved outer surface. The first banks BNL1 may include an organic insulating material such as polyimide, but the embodiments are not limited thereto. In other embodiments, the first banks BNL1 may not be provided.

The electrodes (21 and 22) may extend in one direction and may be disposed in each of the subpixels PXn. The electrodes (21 and 22) may extend in the second direction DR2 and may be disposed to be spaced apart from one another in the first direction DR1. In each of the subpixels PXn, for example, in the first subpixel PX1, first and second electrodes 21 and 22 may be disposed to be spaced apart from each other in the first direction DR1, but the embodiments are not limited thereto. The number and the locations of electrodes (21 and 22) disposed in each of the subpixels PXn may vary depending on the number of light-emitting elements 30 disposed in each of the subpixels PXn.

The first and second electrodes 21 and 22 may be disposed in the emission area EMA of the first subpixel PX1 and may be disposed in part beyond the emission area EMA of the first subpixel PX1 to overlap with the second bank BNL2 in the thickness direction. The electrodes (21 and 22) of the first subpixel PX1 may extend in the second direction DR2 within the first subpixel PX1 and may be spaced apart, in the second direction DR2, from electrodes (21 and 22) of the upper neighboring subpixel PXn, in the second direction DR2, of the first subpixel PX1, in the cut area CBA of the first subpixel PX1.

The first and second electrodes 21 and 22 may extend in the second direction DR2 in the first subpixel PX1. The first and second electrodes 21 and 22 may be separated from the corresponding first and second electrodes 21 and 22 of the upper neighboring subpixel PXn, in the second direction DR2, of the first subpixel PX1 in the cut area CBA of the first subpixel PX1. For example, the cut area CBA of the first subpixel PX1 may be disposed between the emission area EMA of the first subpixel PX1 and an emission area EMA of the upper neighboring subpixel PXn, in the second direction DR2, of the first subpixel PX1. The first and second electrodes 21 and 22 of the first subpixel PX1 may be separated from the corresponding first and second electrodes 21 and 22 of the upper neighboring subpixel PXn, in the second direction DR2, of the first subpixel PX1 in the cut area CBA of the first subpixel PX1. However, the embodiments are not limited thereto. In other embodiments, the electrodes (21 and 22) may extend beyond the first subpixel PX1 into other subpixels PXn that are arranged side-by-side with the first subpixel PX1 in the second direction DR2, without being divided between different subpixels PXn, or only one of the first and second electrodes 21 and 22 may be divided between different subpixels PXn.

The electrodes (21 and 22) may be obtained by forming electrode lines that extend in the second direction DR2 and cutting the electrode lines after the arrangement of the light-emitting element 30. The electrode lines may be used during the fabrication of the electrode lines to form an electric field in the first subpixel PXn to align the light-emitting element 30 during the fabrication of the display device 10. For example, the light-emitting element 30 may be sprayed onto the electrode lines via inkjet printing, and once ink including the light-emitting element 30 is sprayed onto the electrode lines, an electric field is formed by applying alignment signals to the electrode lines. The light-emitting element 30 scattered in the ink receives a dielectrophoretic force from the electric field and may thus be arranged on the electrodes (21 and 22). After the arrangement of the light-emitting element 30, the electrode lines are divided into a plurality of electrodes (21 and 22) to be disposed in each of the subpixels PXn.

The electrodes (21 and 22) may be electrically connected to the third conductive layer so that signals for causing the light-emitting element 30 to emit light may be applied to the electrodes (21 and 22). The first electrode 21 may be in contact with the first conductive pattern CDP through a first contact hole CT1, which penetrates the first planarization layer 19. The second electrode 22 may be in contact with the second voltage line VL2 through a second contact hole CT2, which penetrates the first planarization layer 19. The first electrode 21 may be electrically connected to the first transistor T1 via the first conductive pattern CDP so that the first power supply voltage may be applied to the first electrode 21, and the second electrode 22 may be electrically connected to the second voltage line VL2 so that the second power supply voltage may be applied to the second electrode 22.

The electrodes (21 and 22) may be electrically connected to the light-emitting element 30. The electrodes (21 and 22) may be electrically connected to both end portions of the light-emitting element 30 through the contact electrodes (CNE1 and CNE2) and may transmit electrical signals received from the third conductive layer to the light-emitting element 30. Since the electrodes (21 and 22) are disposed to be divided between different subpixels PXn, light-emitting elements 30 of one subpixel PXn can emit light separately from light-emitting elements 30 of another subpixel PXn.

The first and second contact holes CT1 and CT2 are illustrated as being formed at locations that overlap with the second bank BNL2, but the embodiments are not limited thereto. For example, the first and second contact holes CT1 and CT2 may be located in the emission area EMA of the first subpixel PX1, surrounded by the second bank BNL2.

The electrodes (21 and 22) may be disposed on a pair of first banks BNL1 that are spaced apart from each other. The electrodes (21 and 22) may be disposed on sides, in the first direction DR1, of the first banks BNL1 to be arranged on inclined side surfaces of the first banks BNL1. For example, the width, in the first direction DR1, of the electrodes (21 and 22) may be smaller than the width, in the first direction DR1, of the first banks BNL1. The electrodes (21 and 22) may be disposed to cover at least one side surface of each of the first banks BNL1 to reflect light emitted from the light-emitting element 30, but the embodiments are not limited thereto. The electrodes (21 and 22) may be formed to have a greater width than the first banks BNL1 to cover both inclined side surfaces of each of the first banks BNL1.

The distance, in the first direction DR1, between the electrodes (21 and 22) may be smaller than the distance between the first banks BNL1. At least parts of the electrodes (21 and 22) may be disposed directly on the first planarization layer 19, on the same plane.

The electrodes (21 and 22) may include a conductive material with high reflectance. For example, the electrodes (21 and 22) may include a metal with high reflectance such as silver (Ag), copper (Cu), or Al or may include an alloy of Al, nickel (Ni), or lanthanum (La). The electrodes (21 and 22) may reflect light, emitted from the light-emitting element 30 toward the sides of the first banks BNL1, in an upward direction from the first subpixel PX1.

However, the embodiments are not limited thereto, and the electrodes (21 and 22) may further include a transparent conductive material. For example, the electrodes (21 and 22) may include a material such as ITO, IZO, or indium tin zinc oxide (ITZO). In other embodiments, each of the electrodes (21 and 22) may form a structure in which a transparent conductive material and a metal with high reflectance are stacked into more than one layer or may be formed as a single layer including a transparent conductive material and a metal with high reflectance. For example, each of the electrodes (21 and 22) may include a stack of ITO/Ag/ITO, ITO, ITO/Ag/IZO, or ITO/Ag/ITZO/IZO.

The first insulating layer PAS1 is disposed on the electrodes (21 and 22) and the first banks BNL1. The first insulating layer PAS1 may be disposed to cover the first banks BNL1 and the first and second electrodes 21 and 22, but to expose parts of the top surfaces of the first and second electrodes 21 and 22. Openings OP may be formed in the first insulating layer PAS1 to expose parts of the top surfaces of the electrodes (21 and 22) disposed on the first banks BNL1, and the contact electrodes (CNE1 and CNE2) may be in contact with the electrodes (21 and 22) through the openings OP.

For example, the first insulating layer PAS1 may be formed to have a recessed top surface between the first and second electrodes 21 and 22. As the first insulating layer PAS1 may be disposed to cover the first and second electrodes 21 and 22, the first insulating layer PAS1 may be formed to be recessed between the first and second electrodes 21 and 22, but the embodiments are not limited thereto. The first insulating layer PAS1 may protect the first and second electrodes 21 and 22 and may insulate the first and second electrodes 21 and 22 from each other. Also, the first insulating layer PAS1 may prevent the light-emitting element 30 from being in direct contact with, and thereby damaged by, other elements.

The second bank BNL2 may be disposed on the first insulating layer PAS1. In a plan view, the second bank BNL2 may include parts that extend in the first direction DR1 and parts that extend in the second direction DR2 and may thus be arranged in a lattice pattern. The second bank BNL2 may be disposed along the boundaries of each of the subpixels PXn to define each of the subpixels PXn. Also, the second bank BNL2 may be disposed to surround the emission area EMA and the cut area CBA of each of the subpixels PXn to separate the emission area EMA and the cut area CBA of each of the subpixels PXn. Parts of the second bank BNL2 that extend in the second direction DR2, between the emission areas EMA of the subpixels PXn, may have a greater width than parts of the second bank BNL2 that extend in the second direction DR2, between the cut areas CBA of the subpixels PXn, and the distance between the cut areas CBA of the subpixels PXn may be smaller than the distance between the emission areas EMA of the subpixels PXn. However, the embodiments are not limited thereto. The parts of the second bank BNL2 that extend in the second direction DR2, between the emission areas EMA of the subpixels PXn, may have a smaller width than the parts of the second bank BNL2 that extend in the second direction DR2, between the cut areas CBA of the subpixels PXn, and the distance between the cut areas CBA of the subpixels PXn may be greater than the distance between the emission areas EMA of the subpixels PXn.

The second bank BNL2 may be formed to have a greater height than the first banks BNL1. The second bank BNL2 may prevent ink from spilling over between different subpixels PXn in an inkjet printing process during the fabrication of the display device 10 and may divide ink having light-emitting elements 30 scattered therein between different subpixels PXn to prevent mixture of the ink. The second bank BNL2, like the first banks BNL1, may include polyimide, but the embodiments are not limited thereto.

The light-emitting element 30 may be disposed on the first insulating layer PAS1. Light-emitting elements 30 may be disposed to be spaced apart from one another in the direction in which the electrodes (21 and 22) extend, i.e., in the second direction DR2, and may be aligned substantially in parallel to one another. The light-emitting element 30 may extend in one direction, and the direction in which the electrodes (21 and 22) extend may form a substantially right angle with the direction in which the light-emitting element 30 extends. However, the embodiments are not limited thereto. The light-emitting element 30 may be arranged diagonally with respect to the direction in which the electrodes (21 and 22) extend.

The light-emitting element 30 may include semiconductor layers that are doped to have different conductivity types. As the light-emitting element 30 includes multiple semiconductor layers, the light-emitting element 30 may be aligned so that first end portions may face a particular direction depending on the direction of an electric field formed on the electrodes (21 and 22). Also, the light-emitting element 30 may include a light-emitting layer 36 (refer to FIG. 4) and may thus emit light of a particular wavelength range. Light-emitting layers 36 of different light-emitting elements 30 may emit light of different wavelength ranges depending on the material(s) thereof, but the embodiments are not limited thereto. Different light-emitting elements 30 may emit light of the same color.

Multiple layers may be arranged in the light-emitting element 30, in a direction perpendicular to the top surface of the first substrate 11. The light-emitting element 30 may be arranged such that a direction in which the light-emitting element 30 extends may be parallel to the first substrate 11, and the semiconductor layers included in the light-emitting element 30 may be sequentially arranged in a direction parallel to the top surface of the first substrate 11. However, the embodiments are not limited thereto. The layers included in the light-emitting element 30 may be arranged in a direction perpendicular to the first substrate 11.

The light-emitting element 30 may be disposed on the electrodes (21 and 22), between the first banks BNL1. For example, the first end portion of the light-emitting element 30 may be disposed on the first electrode 21, and the second end portion of the light-emitting element 30 may be disposed on the second electrode 22. The length of the light-emitting element 30 may be greater than the distance between the first and second electrodes 21 and 22, and both end portions of the light-emitting element 30 may be disposed on the first and second electrodes 21 and 22.

Both end portions of the light-emitting element 30 may be in contact with the contact electrodes (CNE1 and CNE2). As an insulating film 38 (refer to FIG. 4) is not formed at both ends of the light-emitting element 30 to expose parts of the semiconductor layers and/or an electrode layer 37 (refer to FIG. 4) of the light-emitting element 30, the exposed semiconductor layers may be in contact with the contact electrodes (CNE1 and CNE2), but the embodiments are not limited thereto. At least part of the insulating film 38 may be removed so that parts of side surfaces of the semiconductor layers of the light-emitting element 30 may be exposed. The exposed side surfaces of the semiconductor layers may be in direct contact with the contact electrodes (CNE1 and CNE2).

The light-emitting element 30 may include an insulating structure 39 (refer to FIG. 4), which is formed at one end of the light-emitting element 30. The light-emitting element 30 may extend in one direction and may include first and second end portions, which are opposite to each other, in the direction in which the light-emitting element 30 extends. The first and second end portions of the light-emitting element 30 may be disposed on the first and second electrodes 21 and 22, respectively, and in a cross-sectional view, side surfaces of the first and second end portions of the light-emitting element 30 may be in contact with first and second contact electrodes CNE1 and CNE2, respectively. The insulating structure 39 may be formed at the first end portion of the light-emitting element 30. The first contact electrode CNE1 may be in contact not only with the side surface of the first end portion of the light-emitting element 30 where the insulating structure 39 is formed, but also with the insulating structure 39. The second contact electrode CNE2 may be in contact with the side surface of the second end portion of the light-emitting element 30 where the insulating structure 39 is not formed. The contact relationship between the light-emitting element 30 and the contact electrodes (CNE1 and CNE2) will be described below in detail.

A second insulating layer PAS2 may be disposed in part on the first insulating layer PAS1 and on the light-emitting element 30. For example, the second insulating layer PAS2 may be disposed to surround parts of outer surfaces of the light-emitting element 30, but not cover the first end portions and the second end portions of the light-emitting element 30. Also, the second insulating layer PAS2 may be disposed even on the first banks BNL1 and the second bank BNL2. The second insulating layer PAS2 may be disposed not only on the light-emitting element 30, but also on the first banks BNL1 and the second bank BNL2, to expose both end portions of the light-emitting element 30 and parts of the first insulating layer PAS1 where the electrodes 21 and 22 are disposed. During the fabrication of the display device 10, the second insulating layer PAS2 may be initially disposed on the first insulating layer PAS1 and on the second bank BNL2 and may then be partially removed to expose both end portions of the light-emitting element 30.

Parts of the second insulating layer PAS2 disposed on the light-emitting element 30 may extend in the second direction DR2, over the first insulating layer PAS1, and may thus form linear or island patterns in the first subpixel PX1. The second insulating layer PAS2 may protect and fix (e.g., onto the first insulating layer PAS1) the light-emitting element 30 during the fabrication of the display device 10. Also, the second insulating layer PAS2 may be disposed to fill the space between the light-emitting element 30 and the first insulating layer PAS1.

Multiple contact electrodes (CNE1 and CNE2) and a third insulating layer PAS3 may be disposed on the second insulating layer PAS2. The first and second contact electrodes CNE1 and CNE2 may be disposed in part on the first and second electrodes 21 and 22, respectively. The first contact electrode CNE1 may be disposed on the first electrode 21, the second contact electrode CNE2 may be disposed on the second electrode 22, and the first and second contact electrodes CNE1 and CNE2 may extend in the second direction DR2. The first and second contact electrodes CNE1 and CNE2 may be spaced apart from, and face, each other in the first direction DR1 and may form linear patterns in the emission area EMA of the first subpixel PX1.

The contact electrodes (CNE1 and CNE2) may be in electrical contact with the light-emitting element 30 and with the electrodes (21 and 22). The light-emitting element 30 may have the semiconductor layers exposed at both ends thereof, and the first and second contact electrodes CNE1 and CNE2 may be in contact with the light-emitting element 30, at both ends of the light-emitting element 30 where the semiconductor layers of the light-emitting element 30 are exposed. The first end portion of the light-emitting element 30 may be electrically connected to the first electrode 21 via the first contact electrode CNE1, and the second end portion of the light-emitting element 30 may be electrically connected to the second electrode 22 via the second contact electrode CNE2.

FIG. 3 illustrates that one first contact electrode CNE1 and one second contact electrode CNE2 are disposed in the first subpixel PX1, but the embodiments are not limited thereto. The numbers of first contact electrodes CNE1 and second contact electrodes CNE2 provided in each of the subpixels PXn may vary depending on the numbers of first electrodes 21 and second electrodes 22 provided in each of the subpixels PXn.

The contact electrodes (CNE1 and CNE2) may include a conductive material. For example, the contact electrodes (CNE1 and CNE2) may include ITO, IZO, ITZO, or aluminum (Al). For example, the contact electrodes (CNE1 and CNE2) may include a transparent conductive material, and light emitted from the light-emitting element 30 may travel toward the electrodes (21 and 22) through the contact electrodes (CNE1 and CNE2). However, the embodiments are not limited thereto.

The third insulating layer PAS3 may be disposed not only on the first contact electrode CNE1, but also on the second insulating layer PAS2, in regions other than a region where the second contact electrode CNE2 is disposed. The third insulating layer PAS3 may be disposed on the entire surfaces of the second contact electrode CNE2 and the second insulating layer PAS2 in regions other than a region where the first contact electrode CNE1 is disposed. The third insulating layer PAS3 may insulate the first and second contact electrodes CNE1 and CNE2 so that the first and second contact electrodes CNE1 and CNE2 may not be in direct contact with each other. The first and second contact electrodes CNE1 and CNE2 may be disposed on different layers. The second contact electrode CNE2 may be disposed in part directly on the second insulating layer PAS2, and the first contact electrode CNE1 may be disposed in part directly on the third insulating layer PAS3. The first and second contact electrodes CNE1 and CNE2 may be disposed directly on the first insulating layer PAS1, in regions where both end portions of the light-emitting element 30 are exposed due to the absence of the second and third insulating layers PAS2 and PAS3.

The third insulating layer PAS3 may be disposed between the first and second contact electrodes CNE1 and CNE2 and may thus insulate the first and second contact electrodes CNE1 and CNE2 from each other. As mentioned above, in some embodiments, the third insulating layer PAS3 may not be provided, in which case, the first and second contact electrodes CNE1 and CNE2 may be disposed on the same layer.

Although not specifically illustrated, an insulating layer may be further disposed on the second insulating layer PAS2, the third insulating layer PAS3, and the contact electrodes (CNE1 and CNE2) to cover the second insulating layer PAS2, the third insulating layer PAS3, and the contact electrodes (CNE1 and CNE2). The insulating layer may be disposed on the entire surface of the first substrate 11 to protect the elements disposed on the first substrate 11 from an external environment.

The first, second, and third insulating layers PAS1, PAS2, and PAS3 may include an inorganic insulating material or an organic insulating material. For example, the first, second, and third insulating layers PAS1, PAS2, and PAS3 may include an inorganic insulating material such as silicon oxide, silicon nitride, silicon oxynitride, aluminum oxide ($AlO_x$), or aluminum nitride ($AlN_x$), but the embodiments are not limited thereto. In another example, the first, second, and third insulating layers PAS1, PAS2, and PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the embodiments are not limited thereto.

Figure 4:
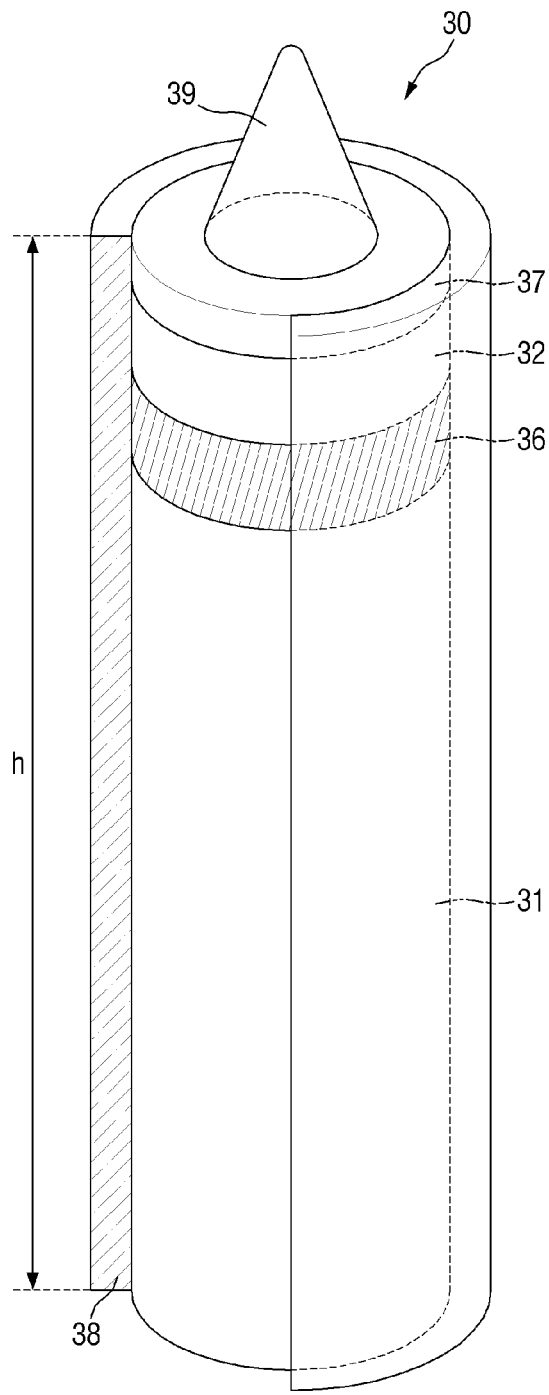
FIG. 4 is a schematic perspective view of a light-emitting element according to an embodiment.
Figure 5:
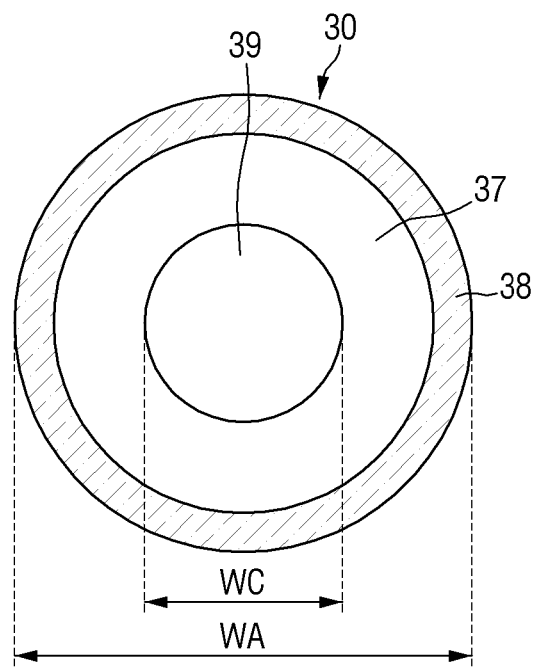
FIG. 5 is a schematic top view of the light-emitting element of FIG. 4.
Figure 6:
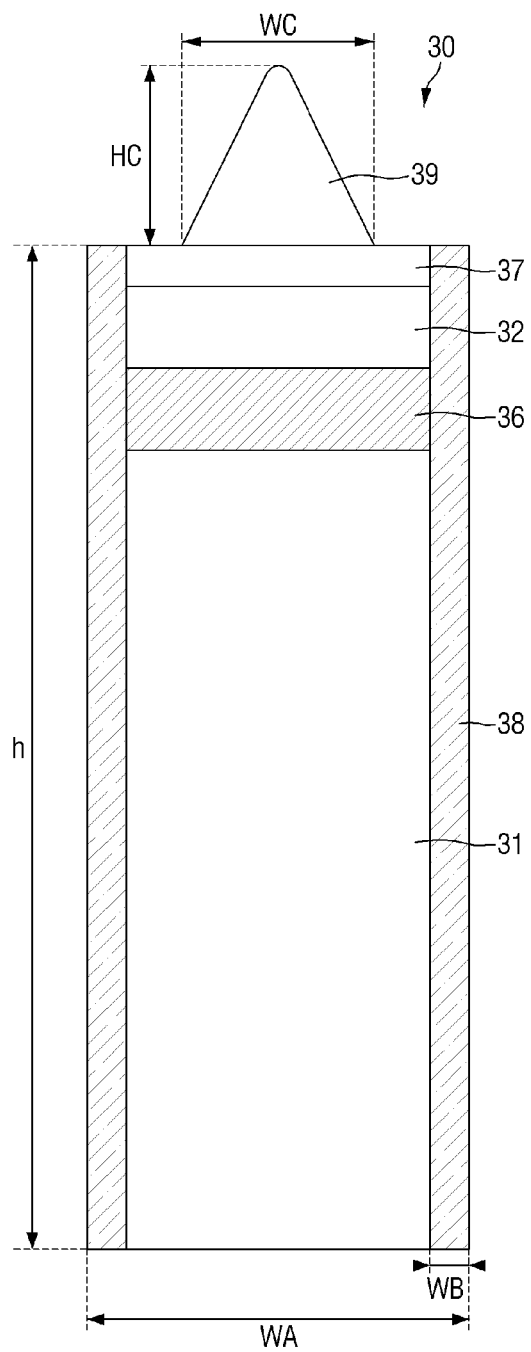
FIG. 6 is a schematic cross-sectional view of the light-emitting element of FIG. 4.

FIG. 4 is a perspective view of a light-emitting element according to an embodiment. FIG. 5 is a top view of the light-emitting element of FIG. 4. FIG. 6 is a cross-sectional view of the light-emitting element of FIG. 4. FIG. 4 illustrates a light-emitting element 30 having part of the insulating film 38 cut out to expose semiconductor layers surrounded by the insulating film 38.

Referring to FIG. 4, a light-emitting element 30 may be a light-emitting diode (LED), particularly, an ILED having a size of several micrometers or nanometers (e.g., a few or several nanometers, or a few or several micrometers) and formed of an inorganic material. If an electric field is formed in a particular direction between two opposite electrodes, the ILED may be aligned between the two electrodes where polarities are formed. The light-emitting element 30 may be aligned by the electric field formed between the two electrodes.

The light-emitting element 30 may have a shape that extends in one direction. The light-emitting element 30 may have the shape of a cylinder, a rod, a wire, or a tube, but the embodiments are not particularly limited by the shape of light-emitting element 30. The light-emitting element 30 may have the shape of a polygonal column such as a regular cube, a rectangular parallelepiped, or a hexagonal column or may have a shape that extends in one direction but with a partially inclined outer surface. Multiple semiconductors included in the light-emitting element 30 may be sequentially disposed or stacked in the direction in which the light-emitting element 30 extends.

The light-emitting element 30 may include semiconductor layers doped with impurities of any conductivity type (e.g., a p-type or an n-type). The semiconductor layers may receive electrical signals from an external power source to emit light of a particular wavelength range.

Referring to FIGS. 4 through 6, the light-emitting element 30 may include a first semiconductor layer 31, a second semiconductor layer 32, the light-emitting layer 36, the electrode layer 37, the insulating film 38, and the insulating structure 39.

The first semiconductor layer 31 may include an n-type semiconductor. In a case where the light-emitting element 30 emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length in a range of about 1.5 μm to about 5 μm, but the embodiments are not limited thereto.

The second semiconductor layer 32 may be disposed on the light-emitting layer 36. The second semiconductor layer 32 may include a p-type semiconductor. In a case where the light-emitting element 30 emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length in a range of about 0.05 μm to about 0.10 μm, but the embodiments are not limited thereto.

FIG. 3 illustrates that the first and second semiconductor layers 31 and 32 are formed as single layers, but the embodiments are not limited thereto. Each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 can emit blue light having a central wavelength range of about 450 nm to about 495 nm.

However, the embodiments are not limited thereto. The light-emitting layer 36 may have a structure in which a semiconductor material having a large band gap energy and a semiconductor material having a small band gap energy are alternately stacked or may include group-III or group-V semiconductor materials depending on the wavelength of light to be emitted. The embodiments are not limited by type of light emitted by the light-emitting layer 36. The light-emitting layer 36 may emit light of a red or green wavelength range as necessary, instead of blue light. The light-emitting layer 36 may have a length in a range of about 0.05 μm to about 0.10 μm, but the embodiments are not limited thereto.

Light may be emitted not only from the circumferential surface, in a length direction, of the light-emitting element 30, but also from both sides of the light-emitting element 30. The embodiments are not limited by directionality of the light emitted from the light-emitting layer 36.

The electrode layer 37 may be an ohmic contact electrode, but the embodiments are not limited thereto. In another example, the electrode layer 37 may be a Schottky contact electrode. The light-emitting element 30 may include at least one electrode layer 37. FIG. 4 illustrates that the light-emitting element 30 includes one electrode layer 37, but the embodiments are not limited thereto. The light-emitting element 30 may include more than one electrode layer 37, or the electrode layer 37 may not be provided. The following description of the light-emitting element 30 may also be directly applicable to a light-emitting element 30 having more than one electrode layer 37 or having a different structure from the light-emitting element 30 of FIG. 4.

The electrode layer 37 may reduce the resistance between the light-emitting element 30 and electrodes (or contact electrodes) when the light-emitting element 30 is electrically connected to the electrodes (or the contact electrodes). The electrode layer 37 may include a conductive metal. For example, the electrode layer 37 may include at least one of Al, Ti, In, gold (Au), Ag, ITO, IZO, and ITZO. Also, the electrode layer 37 may include a semiconductor material doped with an n- or p-type dopant. However, the embodiments are not limited thereto.

The insulating film 38 may be disposed to surround the first and second semiconductor layers 31 and 32 and the electrode layer 37. For example, the insulating film 38 may be disposed to surround at least the light-emitting layer 36 and may extend in the direction in which the light-emitting element 30 extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element 30.

FIG. 4 illustrates that the insulating film 38 is formed to extend in the length direction of the light-emitting element 30 and to cover the sides of the first semiconductor layer 31, the light-emitting layer 36, the second semiconductor layer 32, and the electrode layer 37, but the embodiments are not limited thereto. The insulating film 38 may cover the sides of only the light-emitting layer 36 and some of the first and second semiconductor layers 31 and 32 or may cover only part of the side of the electrode layer 37 so that the side of the electrode layer 37 may be partially exposed. The insulating film 38 may be formed to be rounded in a cross-sectional view, in a region adjacent to at least one end of the light-emitting element 30.

A thickness WB of the insulating film 38 may be about 10 nm to about 1.0 μm, but the embodiments are not limited thereto. Preferably, the thickness WB of the insulating film 38 may be in a range of about 40 nm to about 120 nm.

The insulating film 38 may include a material with insulating properties such as, for example, silicon oxide, silicon nitride, silicon oxynitride, aluminum nitride, aluminum oxide, zirconium oxide ($ZrO_x$), or hafnium oxide ($HfO_x$). Accordingly, the insulating film 38 can prevent any short circuit that may occur when the light-emitting layer 36 is placed in direct contact with electrodes that transmit electrical signals directly to the light-emitting element 30. Also, since the insulating film 38 includes the light-emitting layer 36 to protect the outer surface of the light-emitting element 30, any degradation in the emission efficiency of the light-emitting element 30 may be prevented.

The outer surface of the insulating film 38 may be subjected to surface treatment. The light-emitting element 30 may be sprayed on electrodes while being scattered in an ink. Here, the surface of the insulating film 38 may be hydrophobically or hydrophilically treated to keep the light-emitting element 30 scattered in ink without agglomerating with other neighboring light-emitting elements 30. For example, the insulating film 38 may be surface-treated with a material such as stearic acid or 2,3-naphthalene dicarboxylic acid.

The light-emitting element 30 may include the insulating structure 39, which is disposed on the electrode layer 37. The insulating structure 39 may be disposed to expose part of the top surface of the electrode layer 37. For example, a maximum diameter WC of the insulating structure 39 may be smaller than the diameter of the electrode layer 37, and part of the electrode layer 37 where the insulating structure 39 is not disposed may be exposed. The insulating structure 39 may have the maximum diameter WC at the bottom surface thereof that meets the top surface of the electrode layer 37, and the diameter of the insulating structure 39 may gradually decrease in a direction from the bottom to the top of the insulating structure 39. The insulating structure 39 may be formed in a conical shape with an inclined side surface or in a rod shape having a greater diameter at the bottom than at the top thereof, in a cross-sectional view. In some embodiments, the maximum diameter WC of the insulating structure 39 may be in a range of about 100 nm to about 500 nm, and a height HC of the insulating structure 39 may be in a range of about 500 nm to about 1 μm. However, the embodiments are not limited thereto.

For example, the insulating structure 39 of the light-emitting element 30 may include one of silicon oxide, silicon nitride, and silicon oxynitride as an insulating material. The electrode layer 37 of the light-emitting element 30 may be in contact with, and electrically connected to, the first contact electrode CNE1, but the insulating structure 39, which is disposed on the electrode layer 37, may be in contact with, but not electrically connected to, the first contact electrode CNE1. The maximum diameter WC of the insulating structure 39 may be smaller than the diameter of the electrode layer 37 so that part of the top surface of the electrode layer 37 may be exposed.

The light-emitting element 30 may be obtained by growing a plurality of semiconductor layers on a target substrate via epitaxial growth and etching the grown semiconductor layers in a direction perpendicular to the top surface of the target substrate. The etching of the grown semiconductor layers may be performed by forming a mask layer on the grown semiconductor layers and dry- or wet-etching the grown semiconductor layers along patterns of the mask layer. The light-emitting element 30 may include the electrode layer 37, which is formed of a material such as ITO, and the mask layer, which is for etching the grown semiconductor layers, is disposed on the electrode layer 37. After the etching of the grown semiconductor layers, a chemical treatment process for removing the mask layer that remains on the electrode layer 37 is performed. The etchant used in the chemical treatment process may damage the material of the electrode layer 37, such as ITO. As the electrode layer 37, which is in contact with contact electrodes (CNE1 and CNE2), is damaged, a decrease in the emission efficiency or the luminance of the light-emitting element 10 may be caused.

The removal of the mask layer after the etching of the grown semiconductor layers may not be performed, and the material of the mask layer that remains on the electrode layer 37 may form the insulating structure 39 of the light-emitting element 30. The insulating structure 39 may be disposed on the electrode layer 37 as a separate element, may form a physical boundary with the electrode layer 37, and may protrude from the top surface of the electrode layer 37. A sufficient contact area can be secured between the electrode layer 37 of the light-emitting element 30 and the contact electrodes (CNE1 and CNE2) by etching the grown semiconductor layers, while controlling the etching duration and the type and the concentration of the etchant used, such that part of the top surface of the electrode layer 37 is exposed.

Figure 7:
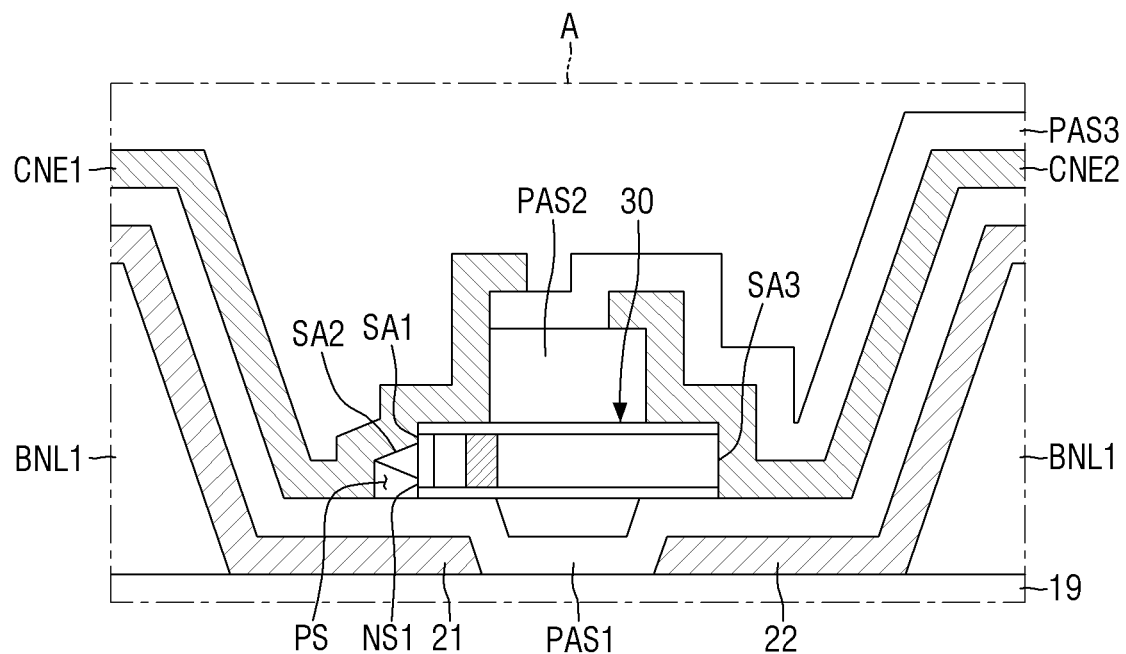
FIG. 7 is an enlarged schematic cross-sectional view of part A of FIG. 3.
Figure 8:
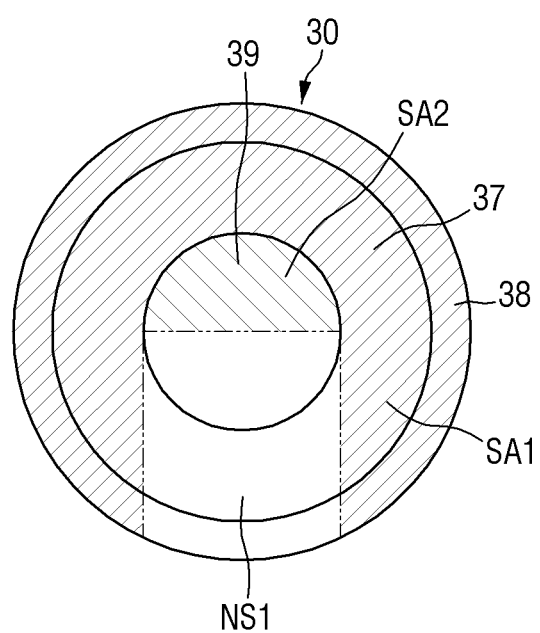
FIG. 8 schematically illustrates the contact surface of the first end portion of a light-emitting element and a first contact electrode of FIG. 3.

FIG. 7 is an enlarged cross-sectional view of part A of FIG. 3. FIG. 8 illustrates the contact surface of the first end portion of the light-emitting element and the first contact electrode of FIG. 3. FIG. 8 is a top view of the electrode layer 37 of the light-emitting element 30 and illustrates contact surfaces (SA1 and SA2) between the first contact electrode CNE1 and the light-emitting element 30.

Referring to FIGS. 7 and 8 and further to FIGS. 3 and 6, the light-emitting element 30 may include a first end portion at which the electrode layer 37 and the insulating structure 39 are disposed and a second end portion which is opposite to the first end portion and at which a lower part of the first semiconductor layer 31 is disposed. The light-emitting element 30 may be arranged so that the direction in which the light-emitting element 30 extends may be parallel to the top surface of the first substrate 11, and the first and second end portions of the light-emitting element 30 may be disposed on the first and second electrodes 21 and 22, respectively. Also, the first and second end portions of the light-emitting element 30 may be in contact with the first and second contact electrodes CNE1 and CNE2, respectively. As the insulating structure 39 is disposed on the electrode layer 37 of the light-emitting element 30, the first contact electrode CNE1 may not be in contact with the entire top surface of the electrode layer 37 and may be in contact, in part, with the insulating structure 39. The second contact electrode CNE2 may be in contact with the entire bottom surface of the first semiconductor layer 31 because of the absence of any intervening element between the second contact electrode CNE2 and the first semiconductor layer 31.

For example, the display device 10 may have a first contact surface SA1 where the first contact electrode CNE1 and the top surface of the electrode layer 37 of the light-emitting element 30 are in contact with each other, a second contact surface SA2 where the first contact electrode CNE1 and the insulating structure 39 are in contact with each other, and a third contact surface SA3 where the second contact electrode CNE2 and the bottom surface of the first semiconductor layer 31 are in contact with each other.

The first contact electrode CNE1 may be formed after the arrangement of the light-emitting element 30 on the electrodes (21 and 22) and the formation of the second insulating layer PAS2, the second contact electrode CNE2, and the third insulating layer PAS3. As the insulating structure 39 is disposed at part of the first end portion of the light-emitting element 30 that is exposed due to the absence of the second and third insulating layers PAS2 and PAS3, a space PS may be formed between the insulating structure 39 and the first insulating layer PAS1 where the light-emitting element 30 is disposed. The first contact electrode CNE1 may surround the outer surfaces of the first end portion of the light-emitting element 30 and the insulating structure 39 and may be in contact with the electrode layer 37, the insulating structure 39, and the insulating film 38 of the light-emitting element 30.

As the first contact electrode CNE1 is disposed to surround the first end portion of the light-emitting element 30, the entire top surface of the electrode layer 37 except for the part covered by the insulating structure 39 may be in contact with the first contact electrode CNE1. The maximum diameter WC of the insulating structure 39 may be controlled to secure a sufficiently large first contact surface SA1 where the first contact electrode CNE1 and the electrode layer 37 are in contact with each other to be electrically connected, regardless of the presence of the insulating structure 39, which is disposed on the electrode layer 37.

The second contact surface SA2 where the first contact electrode CNE1 and the insulating structure 39 are in contact with each other may be formed on an upper part of the side surface of the insulating structure 39, and the first contact electrode CNE1 may surround the side surface of the insulating structure 39 but may not be in contact with a lower part of the side surface of the insulating structure 39. As the insulating structure 39 has a conical shape with an inclined side surface, the second contact surface SA2 may be formed on half of the inclined side surface of the insulating structure 39, but not only the other half of the inclined side surface of the insulating structure 39.

Part of the side surface of the insulating structure 39 that faces the first insulating layer PAS1 and part of the top surface of the electrode layer 37 that is located below the insulating structure 39 in a cross-sectional view may not be in contact with the first contact electrode CNE1. Since the space PS, which is covered by the insulating structure 39, is formed between the insulating structure 39 of the light-emitting device 30 and the first insulating layer PAS1, parts of the top surface of the electrode layer 37 of the light-emitting device 30 and the side surface of the insulating structure 39 may not be in contact with the first contact electrode CNE1. For example, a non-contact surface NS1 that is not in contact with the first contact electrode CNE1 may be formed in part of the exposed top surface of the electrode layer 37 that adjoins the space PS of the insulating structure 39, and part of the side surface of the insulating structure 39 may not be in contact with the first contact electrode CNE1. The first contact electrode CNE1 is illustrated as not being disposed in the space PS between the first insulating layer PAS1 and the insulating structure 39, but the embodiments are not limited thereto. Some of the materials of the first contact electrode CNE1 may be formed in the space PS below the insulating structure 39 during the formation of the first contact electrode CNE1. For example, at least part of the insulating structure 39 of the light-emitting element 30 that adjoins the space PS may include the non-contact surface NS1 that is not in contact with the first contact electrode CNE1.

Since not only the electrode layer 37, but also the top surface of the insulating film 38 is exposed at the top surface of the light-emitting element 30, the first contact surface SA1 may be formed not only in part of the top surface of the electrode layer 37, but also in part of the top surface of the insulating film 38. Similarly, the non-contact surface NS1 may be formed in part of the top surface of the insulating film 38.

As the insulating structure 39 of the light-emitting element 30 is not disposed on the bottom surface of the first semiconductor layer 31, the third contact surface SA3 where the first semiconductor layer 31 of the light-emitting element 30 and the second contact electrode CNE2 are in contact with each other may be larger than the first contact surface SA1. The second contact electrode CNE2 may be in contact with the entire bottom surface of the first semiconductor layer 31 and with the bottom and side surfaces of the insulating film 38.

Light generated by the light-emitting layer 36 of the light-emitting element 30 may be emitted through both end surfaces of the light-emitting element 30. Since the insulating structure 39, unlike the electrode layer 37, includes an insulating material, the insulating structure 39 and the electrode layer 37 may have different refractive indexes. As a result, light generated by the light-emitting element 30 to be emitted through the top surface of the electrode layer 37 can be scattered or diffused by the insulating structure 39.

Figure 9:
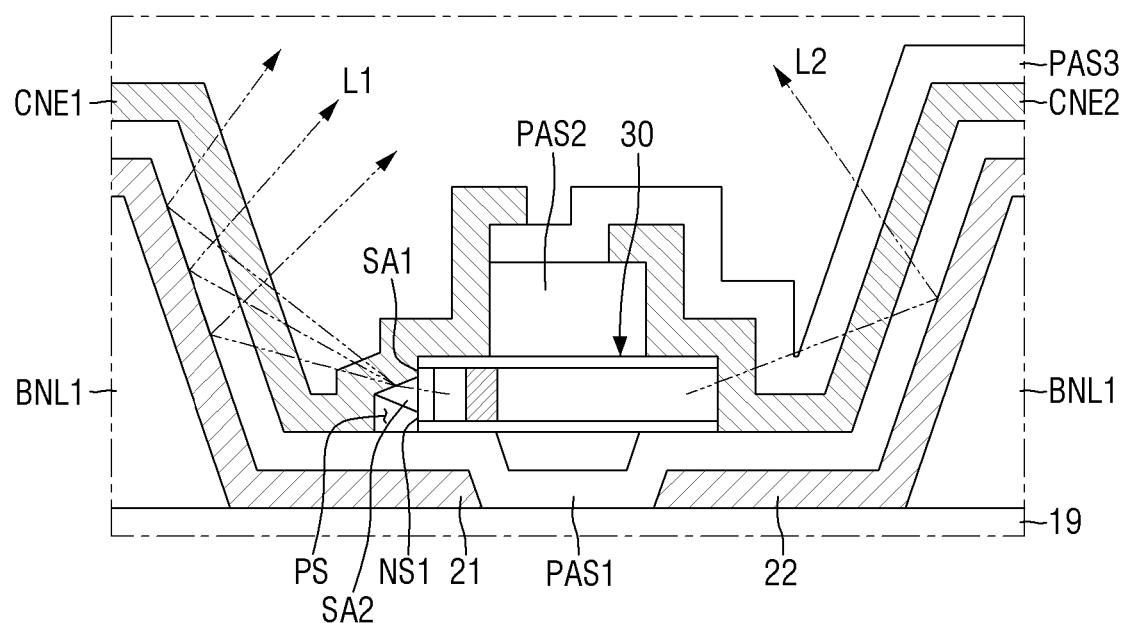
FIG. 9 is an enlarged schematic cross-sectional view illustrating the path of light emitted from the light-emitting element of FIG. 4.

FIG. 9 is an enlarged cross-sectional view illustrating the paths of light emitted from the light-emitting element 30 of FIG. 4.

Referring to FIG. 9, light generated by the light-emitting layer 36 of the light-emitting element 30 may be emitted from both end portions of the light-emitting element 30 through the first and second semiconductor layers 31 and 32. Some of first light L1, which is emitted from the first end portion of the light-emitting element 30 through the second semiconductor layer 32 and the electrode layer 37, may be emitted through the insulating structure 39. The second light L2, which passes through the first semiconductor layer 31, may be emitted from the second end portion of the light-emitting element 30 without passing through the insulating structure 39. The second light L2 may be reflected in an upward direction from the first substrate 11 by the second electrode 22, which is disposed on a side surface of one of the first banks BNL1.

As the electrode layer 37 includes a transparent conductive material and the insulating structure 39 includes an insulating material, a difference in refractive index may arise between the electrode layer 37 and the insulating structure 39. Also, a difference in refractive index may arise even between the first contact electrode CNE1 and the insulating structure 39. As the first light L1 is refracted at the interface between the electrode layer 37 and the insulating structure 39 and at the interface between the insulating structure 39 and the first contact electrode CNE1, the traveling path of the first light L1 may be changed. When light emitted from the first end portion of the light-emitting element 30 proceeds toward the first electrode 21 on one of the banks BNL1, light refracted from the insulating structure 39 may also proceed toward the first electrode 21 close to the upper part of one of the first banks BNL1. As a result, the amount of first light L1 that is reflected from the first electrode 21 and then proceeds in the upward direction from the first substrate 1 may increase, and the emission efficiency of the display device 10 may be improved. Light generated by the light-emitting layer 36 may be scattered depending on the material and the crystalline structure of the insulating structure 39.

A length h of the entire light-emitting element 30 excluding the insulating structure 39 may be in a range of about 1 µm to about 10 µm, or in a range about 2 µm to about 6 µm, preferably, about 3 µm to about 5 µm. The length to which the first semiconductor layer 31, the light-emitting layer 36, the second semiconductor layer 32, and the electrode layer 37 are stacked may be in a range of about 1 µm to about 10 µm, or in a range of about 2 µm to about 6 µm, preferably, about 3 µm to about 5 µm. A diameter WA of the light-emitting element 30 may be in a range of about 30 nm to about 700 nm, and the aspect ratio of the light-emitting element 30 may be in a range of about 1.2 to about 100. However, the embodiments are not limited thereto. Different light-emitting elements 30 may have different diameters depending on the composition of their light-emitting layers 36. Preferably, the diameter WA of the light-emitting element 30 may be about 500 nm.

The fabrication of light-emitting elements 30 will hereinafter be described with reference to FIG. 10.

Figure 10:
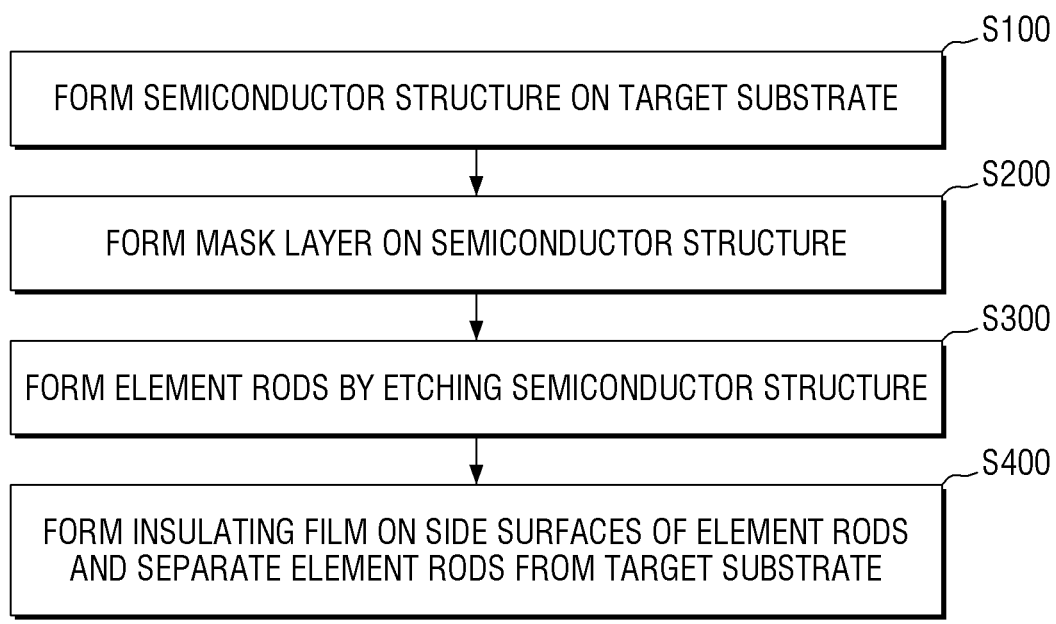
FIG. 10 is a flowchart illustrating a method of fabricating light-emitting elements according to an embodiment.

FIG. 10 is a flowchart illustrating a method of fabricating light-emitting elements according to an embodiment.

Referring to FIG. 10, the method may include: forming a semiconductor structure on a target substrate (S100); forming a mask layer on the semiconductor structure (S200); forming element rods (S300) by etching the semiconductor structure; and forming an insulating film on side surfaces of the element rods and separating the element rods from the target substrate (S400). As mentioned above, light-emitting elements 30 may be fabricated by growing a plurality of semiconductor layers via epitaxial growth and etching the semiconductor layers in a direction perpendicular to the top surface of the target substrate. The etching of a semiconductor structure obtained by growing semiconductor layers may be performed using a mask layer, thereby forming separate element rods, and parts of the mask layer may remain on the element rods, thereby forming insulating structures 39.

The fabrication of light-emitting elements 30 will hereinafter be described in further detail with reference to FIGS. 11 through 18.

FIGS. 11 through 18 are cross-sectional views illustrating the method of FIG. 10.

Figure 11:
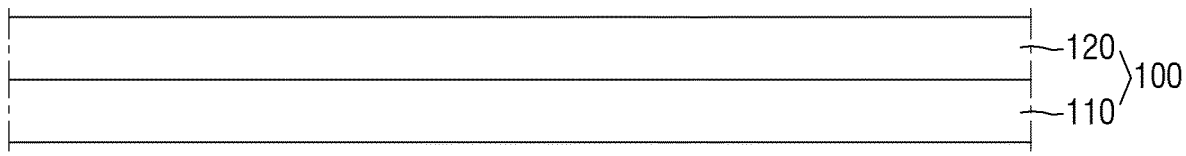
FIGS. 11 through 18 are schematic cross-sectional views illustrating the method of FIG. 10.

Referring first to FIG. 11, a target substrate 100 including a base substrate 110 and a buffer material layer 120 formed on the base substrate 110 is prepared. The base substrate 110 may include a transparent substrate such as a sapphire ($Al_2O_3$) substrate or a glass substrate, but the embodiments are not limited thereto. The base substrate 110 may include a conductive substrate of GaN, SiC, ZnO, Si, GaP, or GaAs. The base substrate 110 will hereinafter be described as being, for example, a sapphire substrate. The embodiments are not limited by the thickness of the base substrate 110. For example, the base substrate 110 may have a thickness in a range of about 400 µm to about 1500 µm.

Semiconductor layers are formed on the base substrate 110. The semiconductor layers may be formed by growing seed crystals via epitaxial growth. Specifically, the semiconductor layers may be formed by electron beam deposition, physical vapor deposition (PVD), chemical vapor deposition (CVD), plasma laser deposition, dual-type thermal evaporation, sputtering, or metal organic chemical vapor deposition (MOCVD), preferably, by MOCVD, but the embodiments are not limited thereto.

The embodiments are not limited by the precursor material for forming the semiconductor layers. For example, the precursor material may include a metal precursor including an alkyl group such as a methyl group or an ethyl group. The metal precursor may be a compound such as trimethyl gallium ($Ga(CH_3)_3$), trimethyl aluminum ($Al(CH_3)_3$), or triethyl phosphate ($(C_2H_5)_3PO_4$), but the embodiments are not limited thereto. The semiconductor layers may be formed by a deposition process using the metal precursor and a non-metal precursor. It will hereinafter be described how and under what conditions the semiconductor layers can be formed. Also, the order in which to fabricate light-emitting elements 30 and the structure of the light-emitting elements 30 will hereinafter be described.

A buffer material layer 120 is formed on the base substrate 110. FIG. 11 illustrates that a single buffer material layer 120 is formed on the base material layer 120, but the embodiments are not limited thereto. Multiple buffer material layers 120 may be formed on the base material layer 120. The buffer material layer 120 may be provided to reduce the difference in lattice constant between a first semiconductor material layer 310, which is to be formed on the buffer material layer 120, and the base substrate 110.

For example, the buffer material layer 120 may include an undoped semiconductor and may include substantially the same material as the first semiconductor material layer 310, but the material of the buffer material layer 120 may be an undoped material. The buffer material layer 120 may include at least one of InAlGaN, GaN, AlGaN, InGaN, AlN, and InN that are not doped, but the embodiments are not limited thereto. The buffer material layer 120 may not be provided depending on the type of the base substrate 110. The buffer material layer 120 will hereinafter be described as being an undoped semiconductor layer formed on the base substrate 110.

Figure 12:
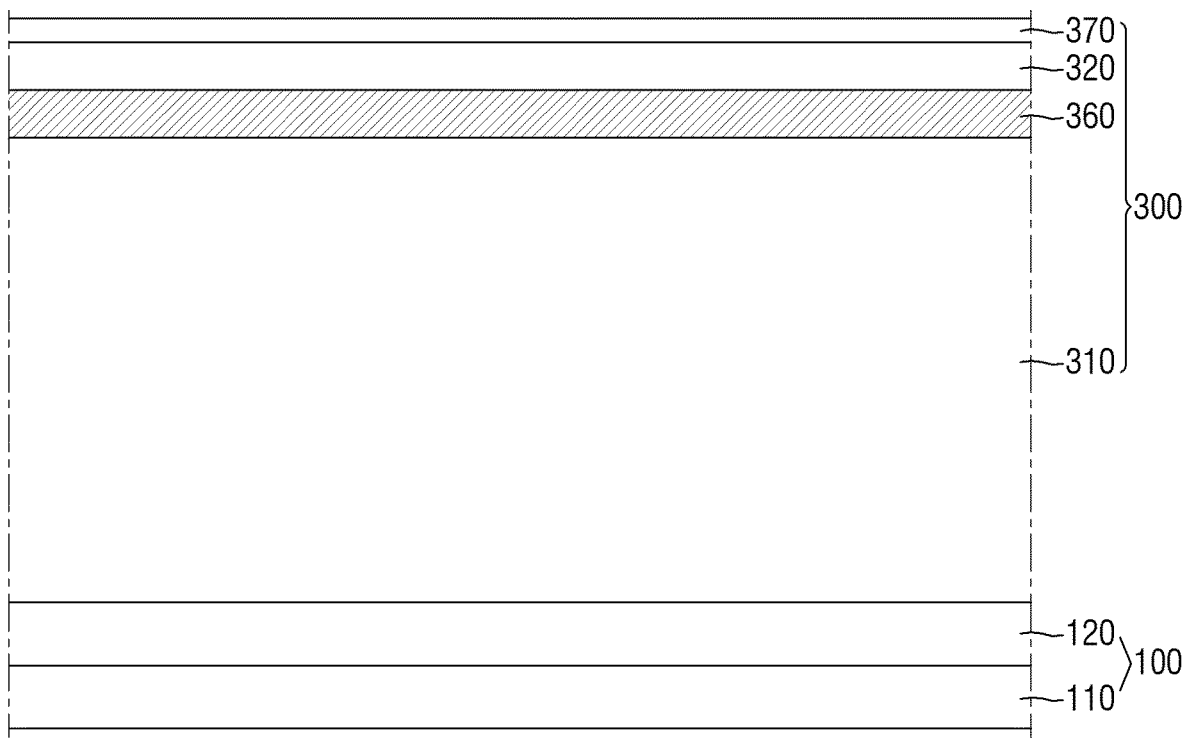

Referring to FIG. 12, a semiconductor structure 300 is formed on the target substrate 100. The semiconductor structure 300 may include the first semiconductor material layer 310, a light-emitting material layer 360, a second semiconductor material layer 320, and an electrode material layer 370. The first semiconductor material layer 310, the light-emitting material layer 360, the second semiconductor material layer 320, and the electrode material layer 370 may be formed by processes mentioned above and may correspond to layers included in light-emitting elements 30 to be formed. The first semiconductor material layer 310, the light-emitting material layer 360, the second semiconductor material layer 320, and the electrode material layer 370 may include the same material as first semiconductor layers 31, light-emitting layers 36, second semiconductor layers 32, and electrode layers 37, respectively, of the light-emitting elements 30.

Figure 13:
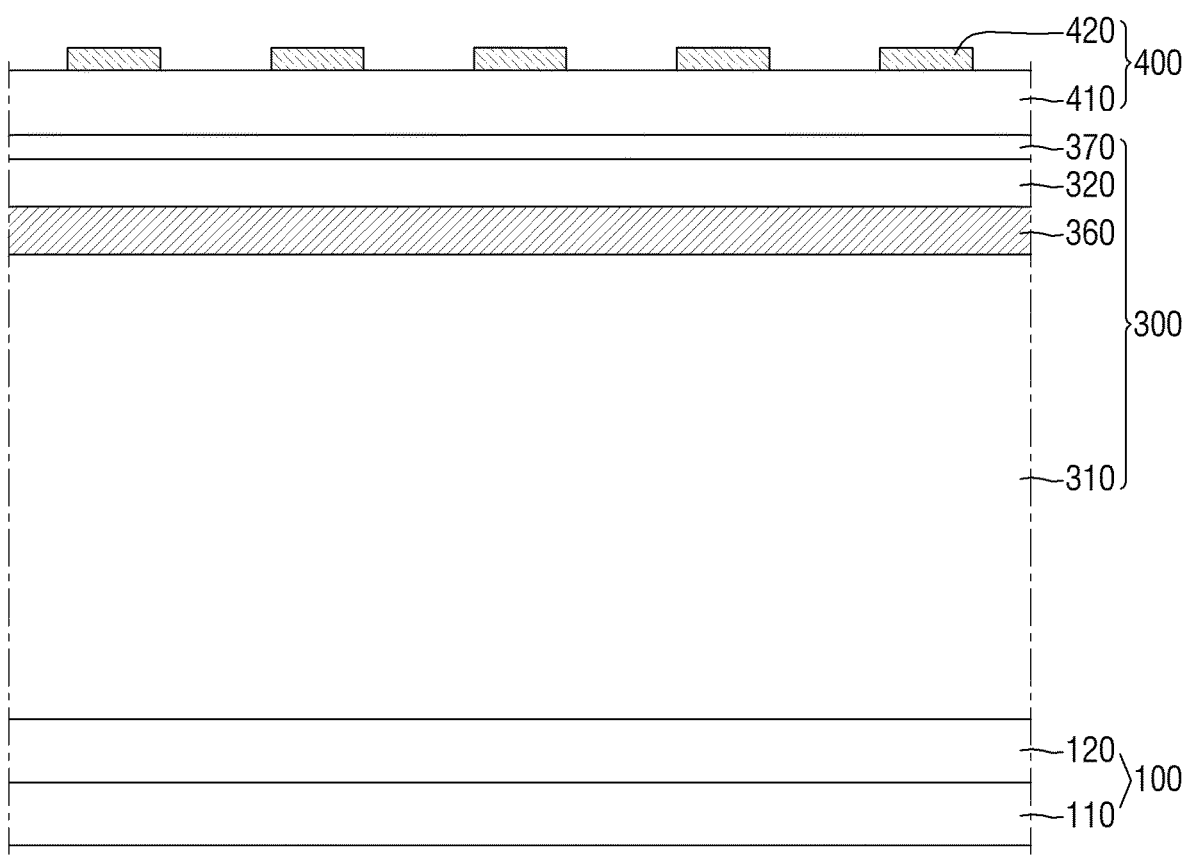
Figure 14:
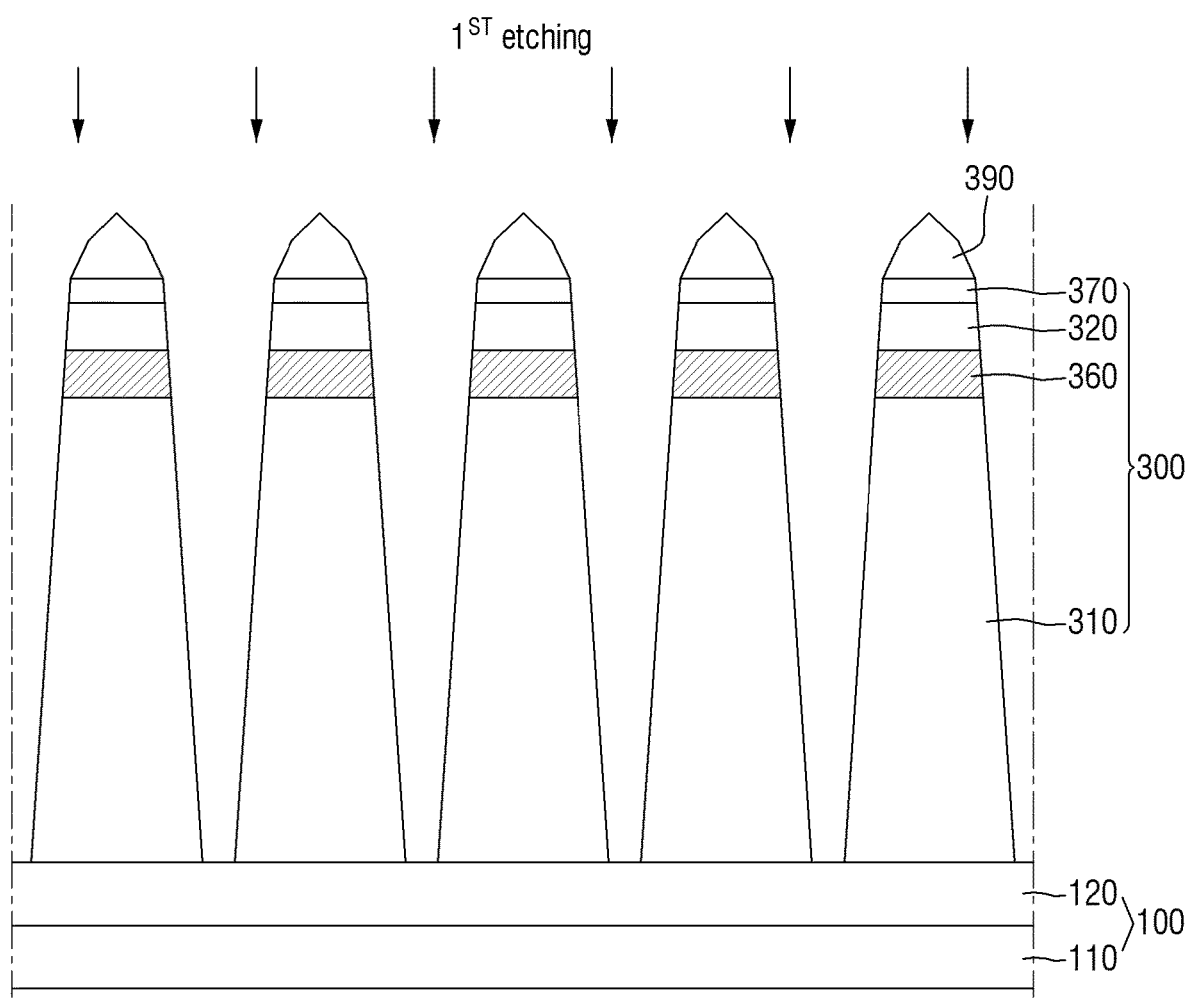
Figure 15:
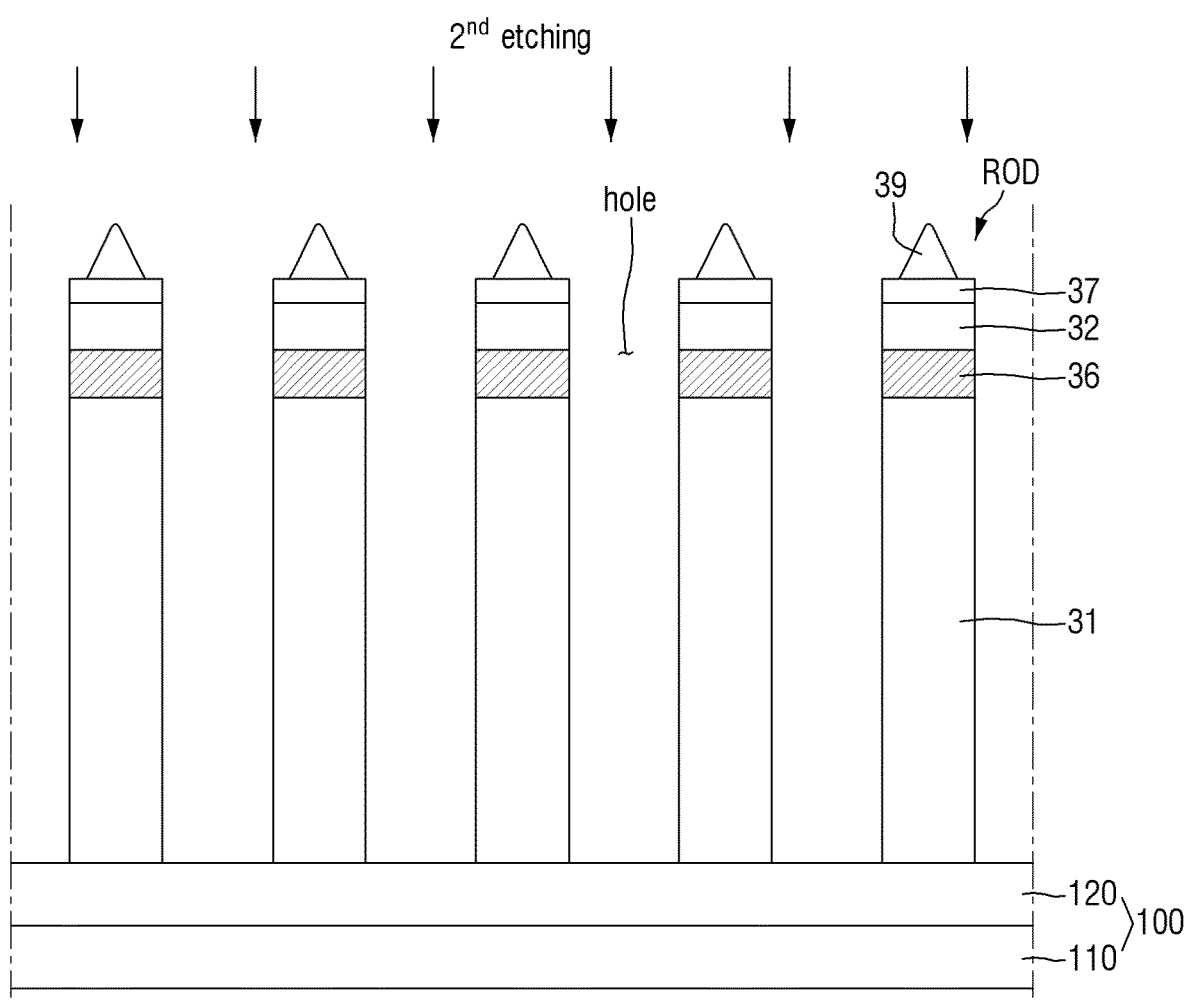

Referring to FIGS. 13 through 15, element rods ROD, which are spaced apart from one another, are formed by etching the semiconductor structure 300. For example, the etching of the semiconductor structure 300 may include forming a mask layer 400 on the semiconductor structure 300, performing a first etching process that etches the semiconductor structure 300 using the mask layer 400, and performing a second etching process that follows the first etching process.

Referring to FIG. 13, the mask layer 400 is formed on the semiconductor structure 300. The mask layer 400 may include an insulating mask layer 410, which is disposed on the electrode material layer 370, and a metal pattern layer 420, which is disposed on the insulating mask layer 410. The metal pattern layer 420 may include a plurality of patterns that are spaced apart from one another, and the insulating mask layer 410 and the semiconductor structure 300 may be etched along the gaps between the patterns of the metal pattern layer 420. In some embodiments, the patterns of the metal pattern layer 420 may have the same diameter or width. Parts of the semiconductor structure 300 that overlap with the patterns of the metal pattern layer 420 and thus remain unetched may form the element rods ROD. Thus, the diameter of the patterns of the metal pattern layer 420 may be the same as the diameter of the electrode layers 37. As the patterns of the metal pattern layer 420 have the same diameter or width, the light-emitting elements 30 may have substantially the same diameter.

The insulating mask layer 410 may include an insulating material, and the metal pattern layer 420 may include a metallic material. For example, the insulating mask layer 410 may include silicon oxide, silicon nitride, or silicon oxynitride. The thickness of the insulating mask layer 410 may be about 1.0 μm to about 2.0 μm, but the embodiments are not limited thereto. The metal pattern layer 420 may include a metal such as chromium (Cr) and may have a thickness of about 30 nm to about 150 nm, but the embodiments are not limited thereto.

Thereafter, referring to FIGS. 14 and 15, a first etching process that etches the insulating mask layer 410 and the semiconductor structure 300 along the patterns of the metal pattern layer 420, in a direction perpendicular to the top surface of the target substrate 100, and then a second etching process are performed.

The first and second etching processes may be formed by dry etching, wet etching, reactive ion etching (RIE), or inductively coupled plasma-reactive ion etching (ICP-RIE). For example, dry etching, particularly, anisotropic dry etching, may be performed and may be suitable to vertically etch the semiconductor structure 300. Here, an etchant such as $Cl_2$ or $O_2$ may be used, but the embodiments are not limited thereto.

For example, the first etching process may be a dry etching process, and the second etching process may be a wet etching process. As a result of the first etching process, parts of the insulating mask layer 410 and parts of the semiconductor structure 300 may be etched away from the gaps between the patterns of the metal pattern layer 420. The insulating mask layer 410 may be partially etched away along the patterns of the metal pattern layer 420 and may thus form a hard mask layer 390, and the metal pattern layer 420 may be removed during the etching of the insulating mask layer 410.

The hard mask layer 390 may have a shape whose width gradually increases from the top to the bottom. The shape of the insulating mask layer 410 may vary depending on the conditions of the first etching process. The shape of the hard mask layer 390 may be substantially as illustrated in FIG. 14, as long as the semiconductor structure 300 is not over-etched to the extent that side surfaces of parts of the hard mask layer 390 are perpendicular to the top surface of the semiconductor structure 300. However, the embodiments are not limited thereto. The hard mask layer 390 may function as a mask for etching the semiconductor structure 300, and the bottom width of the parts of the hard mask layer 390 may be the same as the diameter of the element rods ROD, which are obtained formed by etching the semiconductor structure 300.

The semiconductor structure 300 is etched by the first etching process along the gaps between the parts of the hard mask layer 390. Parts of the semiconductor structure 300 may be etched away from between the parts of the hard mask layer 390, thereby obtaining stack structures whose width increases from the top to the bottom thereof like the hard mask layer 390. Once the semiconductor structure 300 is etched by the first etching process, parts of each of the semiconductor layers that remain unetched may have inclined side surfaces. Thereafter, the second etching process may be performed such that the side surfaces of the remaining parts of each of the semiconductor layers may be perpendicular to the top surface of the target substrate 100, straightening the side surfaces of the semiconductor structure 300.

The insulating mask layer 410 and the semiconductor structure 300 may be etched by a continuous etching process, but the embodiments are not limited thereto. The first etching process may be performed by partially etching the insulating mask layer 410 to form the hard mask layer 390 and etching the semiconductor structure 300 using the hard mask layer 390.

Thereafter, insulating structures 39 are formed by performing the second etching process to partially etch the hard mask layer 390, and the element rods ROD are formed by etching the inclined side surfaces of the parts of each of the semiconductor layers. Holes may be formed in the semiconductor structure 300 by the first and second etching processes, and the layers of the semiconductor structure 300 may be etched to form the element rods ROD, which include the first semiconductor layers 31, the light-emitting layers 36, the second semiconductor layers 32, and the electrode layers 37. The element rods ROD may be spaced apart from one another by the holes. The buffer material layer 120 of the target substrate 100 may be partially exposed in the holes by which the element rods ROD are spaced apart from one another.

Parts of the semiconductor structure 300 that remain unremoved by the first etching process may be etched by the second etching process, which is a wet etching process, such that the side surfaces of the parts of the semiconductor structure 300 may be perpendicular to the top surface of the target substrate 100 and thus, the side surfaces of semiconductor structure 300 are straightened. As a result of the second etching process, the diameter and height of the hard mask layer 390 may be reduced so that the insulating structures 39 may be formed. For example, a wet etching process may be performed as the second etching process, and the duration of the second etching process and the type and the concentration of etchant used in the second etching process may be controlled so that the insulating structures 39 may be formed. The insulating structures 39 that remain on the electrode layers 37 of the element rods ROD may be the remaining parts of the hard mask layer 390, which previously functions as a mask for etching the semiconductor structure 300. If additional etchant treatment is performed to completely remove the remaining parts of the hard mask layer 390 after the second etching process, the surfaces of the electrode layers 37, which include ITO or the like, may be damaged. To prevent this, in the embodiments, a process of removing the insulating structures 39, which are the remaining parts of the insulating mask layer 410, may not be performed after an etching process for forming the element rods ROD. Since an etchant treatment process for removing the insulating structures 39 is not performed, damage to the electrode layers 37 can be prevented, and the light-emitting elements 30 can be properly electrically connected to a first contact electrode CNE1.

In the embodiments, the insulating structures 39 may remain unremoved on the electrode layers 37 of the light-emitting elements 30, and the insulating structures 39 may form contact surfaces with the first contact electrode CNE1. Insulating structures 39 having such a size that the electrode layers 37 of the light-emitting elements 30 can be sufficiently in contact with the first contact electrode CNE1 can be formed by controlling the conditions of the second etching process. The light-emitting elements 30 can be in proper contact with the first contact electrode CNE1 while preventing the electrode layers 37 from being damaged by a chemical treatment process, and as a result, the emission efficiency, and the luminance of the light-emitting elements 30 can be improved.

Although not specifically illustrated, processes of rinsing and drying the insulating structures 39 and the element rods ROD may be performed after the second etching process, which is a wet etching process. In some embodiments, the rinsing of the insulating structures 39 and the element rods ROD may be performed for about five to about ten minutes, and the drying of the insulating structures 39 and the element rods ROD may be performed for about one to about five minutes. However, the embodiments are not limited thereto.

Figure 16:
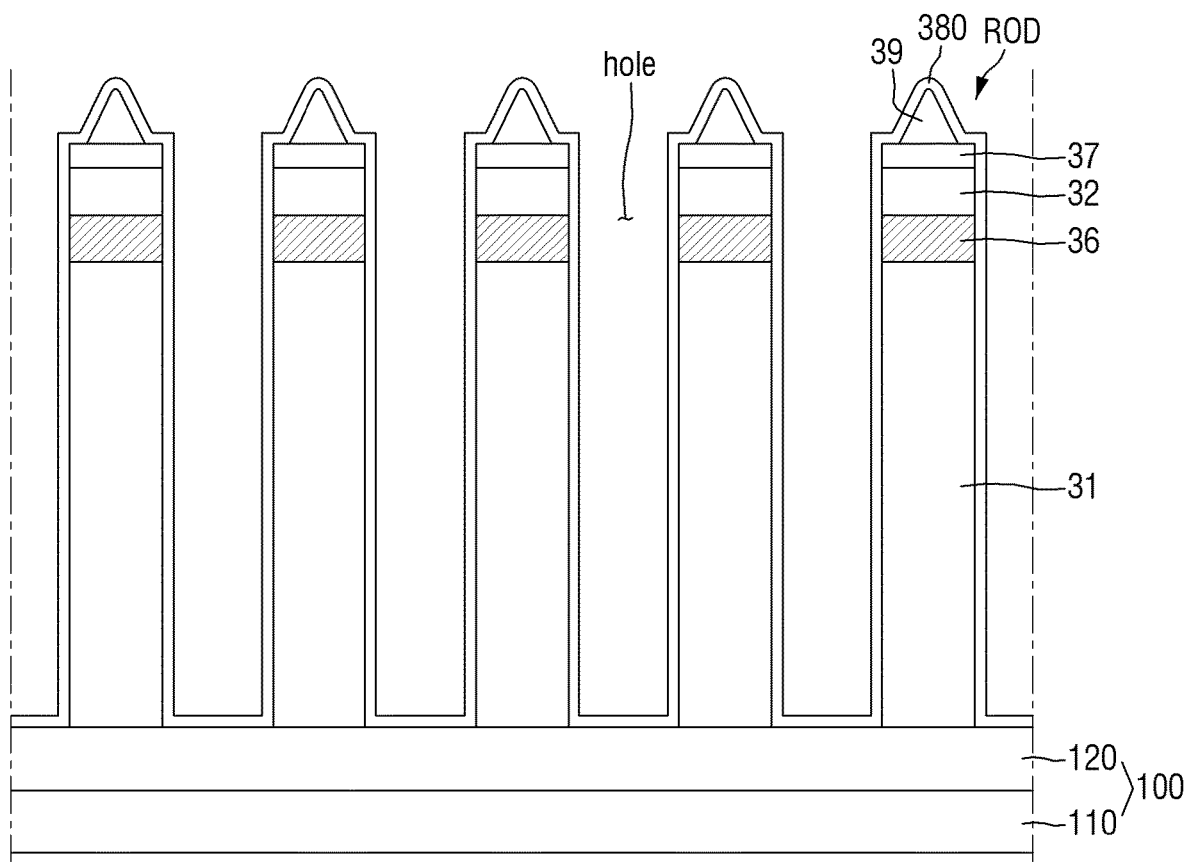
Figure 17:
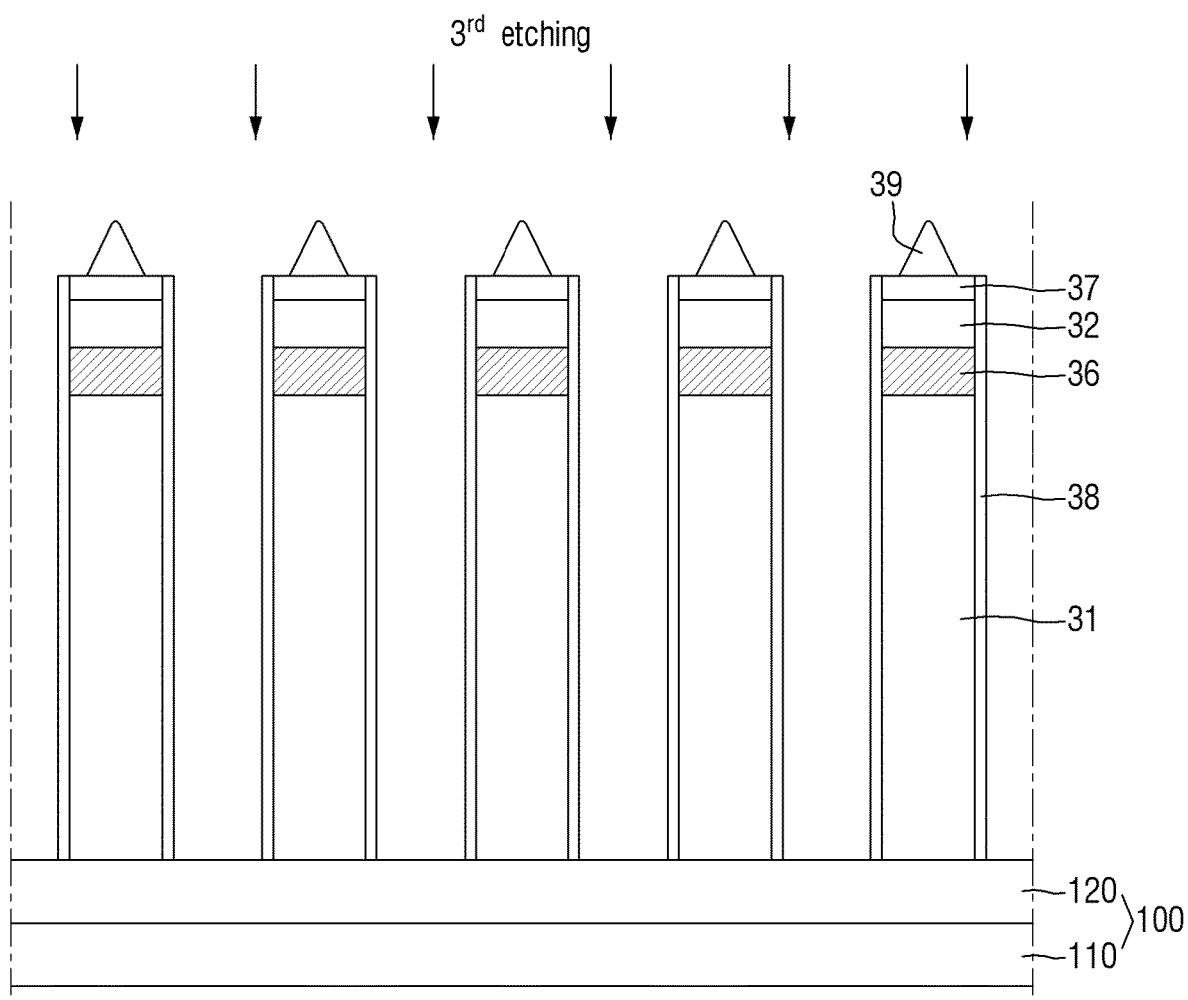

Referring to FIGS. 16 and 17, insulating films 38 are formed to partially surround the side surfaces of the element rods ROD including the insulating structures 39. The insulating films 38 may be formed by forming an insulating layer 380 on outer surfaces of the insulating structure 39 and outer surfaces of the element rods ROD and performing a third etching process that removes parts of the insulating layer 380 and thereby exposes end portions of the element rods ROD, for example, the top surfaces of the electrode layers 37.

The insulating layer 380 may be formed by applying an insulating material on the outer surfaces of the element rods ROD, which are vertically etched, or immersing the element rods ROD in the insulating material, but the embodiments are not limited thereto. For example, the insulating layer 380 may be formed by atomic layer deposition (ALD) or CVD.

The insulating layer 380 may be formed not only on the side surfaces and the top surfaces of the element rods ROD, but also on parts of the target substrate 100 that are exposed between the element rods ROD. The insulating layer 380 may be partially removed by a dry etching process, which is an anisotropic etching process, or an etch-back process. Upper parts of the insulating layer 380 may be removed so that the electrode layers 37 and the insulating structures 39 may be exposed, and in this process, the electrode layers 37 may be partially removed. The electrode layers 37 of the light-emitting elements 30 may be thinner than the electrode material layer 370. Also, the insulating structures 39 may become smaller in size in the light-emitting elements 30 than in the element rods ROD.

The top surfaces of the electrode layers 37 are illustrated as being partially exposed, and the insulating films 38 are illustrated as being flat at the tops thereof. However, the embodiments are not limited thereto. In some embodiments, the insulating films 38 may be formed to be curved in part in areas that surround the electrode layers 37. During the removal of parts of the insulating layer 380, not only the top surface, but also the side surfaces of the insulating layer 380 are partially removed so that the insulating films 38 may be formed to have end surfaces partially etched. As the upper parts of the insulating layer 380 are removed, outer surfaces of the insulating films 38 adjacent to the electrode layers 37 may be formed to be partially removed.

Figure 18:
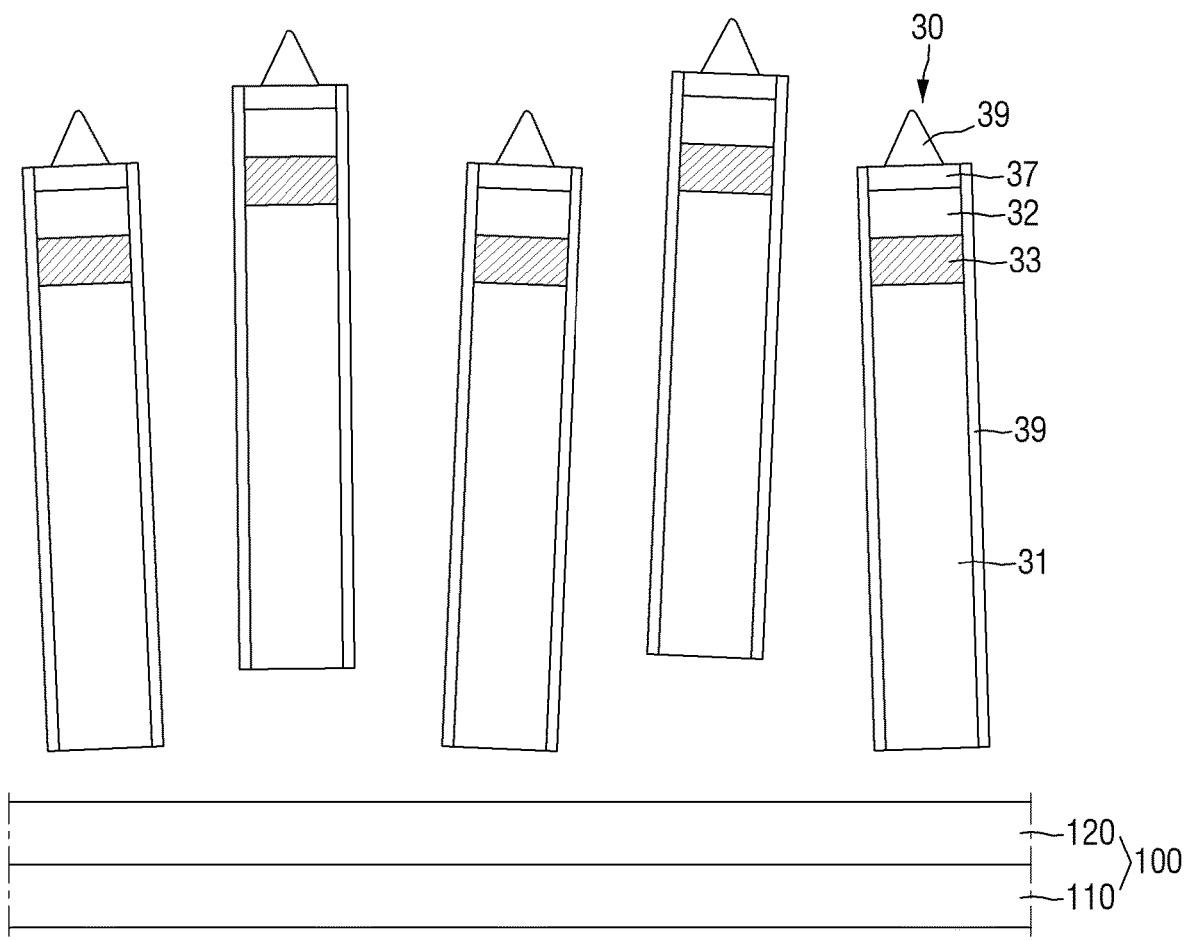

Thereafter, referring to FIG. 18, the element rods ROD, in which the insulating structures 39 and the insulating films 38 are formed, are separated from the target substrate 100, thereby obtaining the light-emitting elements 30.

The embodiments are not limited to the shape and the material of the light-emitting elements 30 described above with reference to FIG. 4. In other embodiments, the light-emitting elements 30 may include more layers or may have a different shape from the light-emitting element 30 of FIG. 4.

Figure 19:
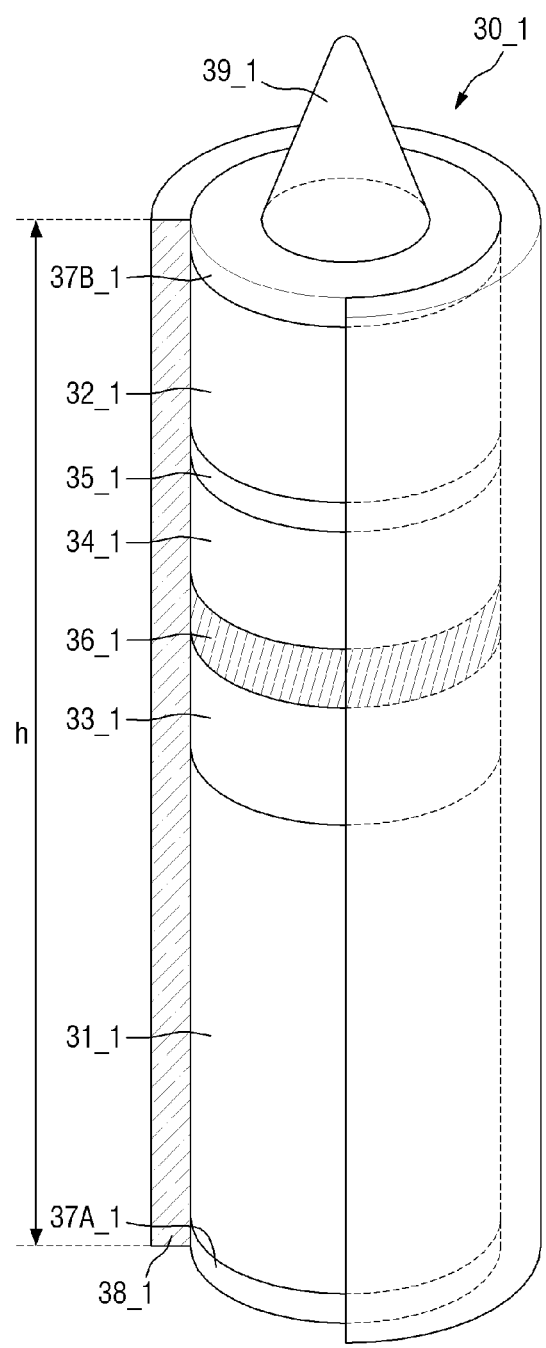
FIG. 19 is a schematic perspective view of a light-emitting element according to an embodiment.
Figure 20:
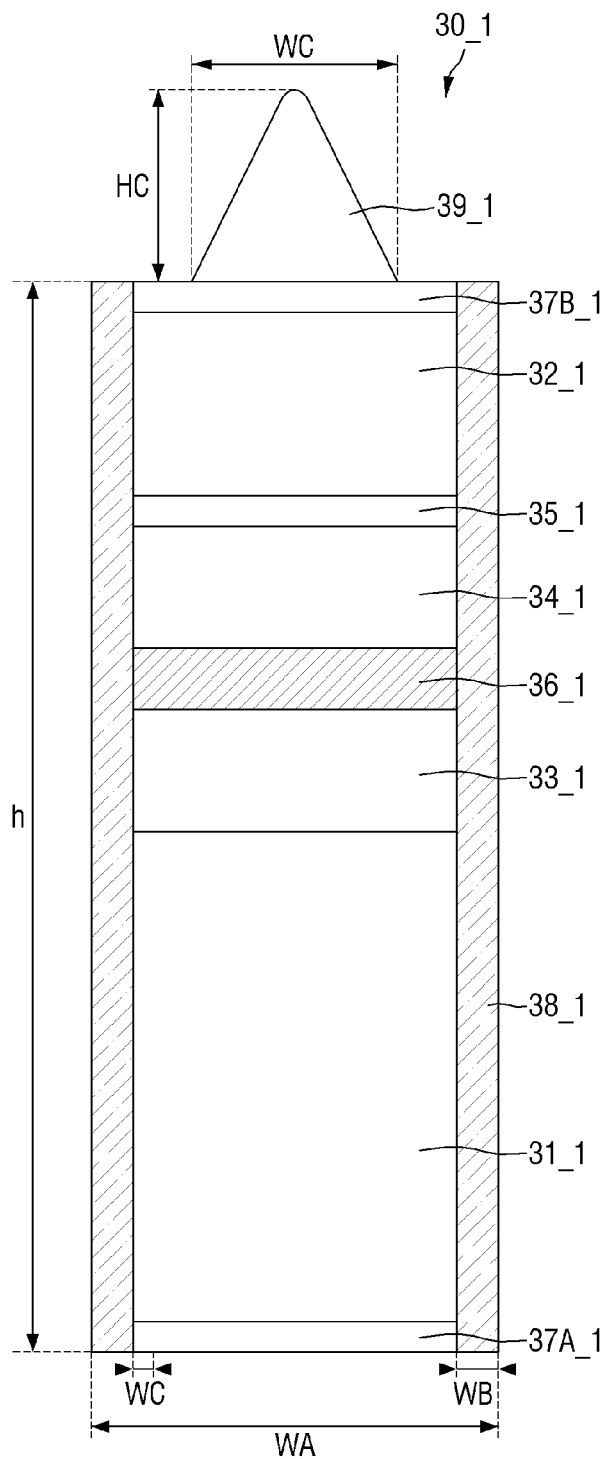
FIG. 20 is a schematic cross-sectional view of the light-emitting element of FIG. 19.

FIG. 19 is a schematic perspective view of a light-emitting element 30_1 according to an embodiment. FIG. 20 is a schematic cross-sectional view, taken in a lengthwise direction, of the light-emitting element 30_1 and illustrates a plurality of semiconductor layers stacked in the light-emitting element 30_1.

Referring to FIGS. 19 and 20, the light-emitting element 30_1 may further include a third semiconductor layer 33_1, which is disposed between a first semiconductor layer 31_1 and a light-emitting layer 36_1, and fourth and fifth semiconductor layers 34_1 and 35_1, which are disposed between the light-emitting layer 36_1 and a second semiconductor layer 32_1. The light-emitting element 30_1 differs from the light-emitting element 30 of FIG. 4 in that it further includes the third, fourth, and fifth semiconductor layers 33_1, 34_1, and 35_1 and first and second electrode layers 37A_1 and 37B_1, and that the light-emitting layer 36_1 includes a different element from the light-emitting layer 36 of FIG. 4. The light-emitting element 30_1 will hereinafter be described, focusing mainly on the differences with the light-emitting element 30 of FIG. 4.

The light-emitting layer 36 of the light-emitting element 30 of FIG. 4 includes nitrogen (N) and thus emits blue or green light. On the contrary, the light-emitting layer 36_1 or other semiconductor layers of the light-emitting element 30_1 of FIG. 19 may be semiconductors containing phosphorus (P). The light-emitting element 30_1 may emit red light having a central wavelength range of about 620 nm to about 750 nm. However, the embodiments are not limited to a particular central wavelength range of the red light emitted by the light-emitting element 30_1 and may encompass all wavelengths that may be perceived as red.

The first semiconductor layer 31_1 may be an n-type semiconductor layer and may include a semiconductor material having the chemical formula $In_xAl_yGa_{1-x-y}P$ (where $0 \leq x \leq 1$, $0 \leq y \leq 1$, and $0 \leq x+y \leq 1$). The first semiconductor layer 31_1 may include any one of InAlGaP, GaP, AlGaP, InGaP, AlP, and InP that are doped with an n-type dopant. For example, the first semiconductor layer 31_1 may be n-AlGaInP doped with n-type Si.

The second semiconductor layer 32_1 may be a p-type semiconductor layer and may include a semiconductor material having the chemical formula $In_xAl_yGa_{1-x-y}P$ (where $0 \leq x \leq 1$, $0 \leq y \leq 1$, and $0 \leq x+y \leq 1$). The second semiconductor layer 32_1 may include any one of InAlGaP, GaP, AlGaNP, InGaP, AlP, and InP that are doped with a p-type dopant. For example, the second semiconductor layer 32_1 may be p-GaP doped with p-type Mg.

The light-emitting layer 36_1 may be disposed between the first and second semiconductor layers 31_1 and 32_1. The light-emitting layer 36_1 may include a material having a single- or multi-quantum well structure and may thus emit light of a particular wavelength range. In a case where the light-emitting layer 36_1 has a structure in which a quantum layer and a well layer are alternately stacked, the quantum layer may include AlGaP or AlInGaP, and the well layer may include GaP or AlInP. For example, the light-emitting layer 36_1 may include AlGaInP as a quantum layer and AlInP as a well layer and may thus emit red light having a central wavelength range of about 620 nm to about 750 nm.

The light-emitting element 30_1 of FIG. 19 may include clad layers disposed adjacent to the light-emitting layer 36_1. The third and fourth semiconductor layers 33_1 and 34_1, which are disposed between the first and second semiconductor layers 31_1 and 32_1, may be clad layers.

The third semiconductor layer 33_1 may be disposed between the first semiconductor layer 31_1 and the light-emitting layer 36_1. The third semiconductor layer 33_1, like the first semiconductor layer 31_1, may be an n-type semiconductor and may include a semiconductor material having the chemical formula $In_xAl_yGa_{1-x-y}P$ (where $0 \leq x \leq 1$, $0 \leq y \leq 1$, and $0 \leq x+y \leq 1$). For example, the first semiconductor layer 31_1 may be n-AlGaInP, and the third semiconductor layer 33_1 may be n-AlInP. However, the embodiments are not limited thereto.

The fourth semiconductor layer 34_1 may be disposed between the light-emitting layer 36_1 and the second semiconductor layer 32_1. The fourth semiconductor layer 34_1, like the second semiconductor layer 32_1, may be a p-type semiconductor and may include a semiconductor material having the chemical formula $In_xAl_yGa_{1-x-y}P$ (where $0 \leq x \leq 1$, $0 \leq y \leq 1$, and $0 \leq x+y \leq 1$). For example, the second semiconductor layer 32_1 may be p-GaP, and the fourth semiconductor layer 34_1 may be p-AlInP.

The fifth semiconductor layer 35_1 may be disposed between the second and fourth semiconductor layers 32_1 and 34_1. The fifth semiconductor layer 35_1, like the second and fourth semiconductor layers 32_1 and 34_1, may be a semiconductor doped with a p-type dopant. In some embodiments, the fifth semiconductor layer 35_1 may be provided to reduce the difference in lattice constant between the second and fourth semiconductor layers 32_1 and 34_1. The fifth semiconductor layer 35_1 may be a tensile strain barrier reduction (TSBR) layer. For example, the fifth semiconductor layer 35_1 may include p-GaInP, p-AlInP, or p-AlGaInP, but the embodiments are not limited thereto. The third, fourth, and fifth semiconductor layers 33_1, 34_1, and 35_1 may have a length in a range of about 0.08 μm to about 0.25 μm, but the embodiments are not limited thereto.

The first and second electrode layers 37A_1 and 37B_1 may be disposed on the first and second semiconductor layers 31_1 and 32_1, respectively. The first electrode layer 37A_1 may be disposed on the bottom surface of the first semiconductor layer 31_1, and the second electrode layer 37B_1 may be disposed on the top surface of the second semiconductor layer 32_1. However, the embodiments are not limited thereto, and one of the first and second electrode layers 37A_1 and 37B_1 may not be provided. For example, the light-emitting element 30_1 may not have the first electrode layer 37A_1 on the bottom surface of the first semiconductor layer 31_1, but may include only the second electrode layer 37B_1 on the top surface of the second semiconductor layer 32_1. The light-emitting element 30_1 may further include other semiconductor layers than those illustrated in in FIGS. 19 and 20 and may emit red light.

An insulating structure 39_1 may be disposed on the second electrode layer 37B_1. The light-emitting element 30_1 may be fabricated by depositing multiple semiconductor layers to form a semiconductor structure 300 and etching the semiconductor structure 300. The second electrode layer 37B_1 may be formed on the second semiconductor layer 32_1 after sequentially depositing multiple semiconductor layers, starting with the first semiconductor layer 31_1. Then, a mask layer 400 for etching the semiconductor structure 300 may be formed, and the insulating structure 39_1 may be formed on the second electrode layer 37B_1 by etching the semiconductor structure 300 using the mask layer 400. The first electrode layer 37A_1 may be formed on the bottom surface of the semiconductor layer 31_1 after separating an element rod with the insulating structure 39_1 formed therein from a target substrate 100. Accordingly, even if the light-emitting element 30_1 includes a considerable number of semiconductor layers, the insulating structure 39_1 can be disposed only on the second electrode layer 37B_1 on the second semiconductor layer 32_1.

Figure 21:
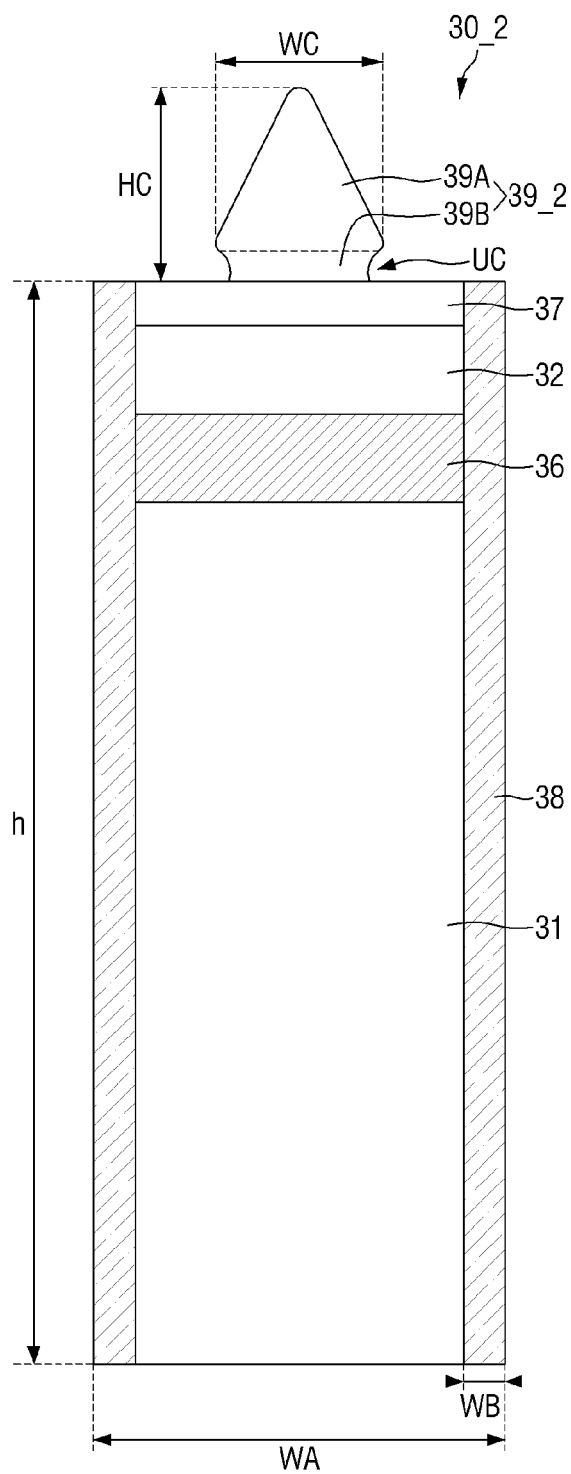
FIG. 21 is a schematic cross-sectional view of a light-emitting element according to an embodiment.

FIG. 21 is a schematic cross-sectional view of a light-emitting element according to an embodiment.

Referring to FIG. 21, a light-emitting element 30_2, according to the embodiments, may include an insulating structure 39_2 with an undercut UC formed at the bottom thereof. The insulating structure 39_2 may include a first portion 39A, which has an inclined side surface, and a second portion 39B, which is connected to a lower part of the first portion 39A and at which the undercut UC is formed.

During the fabrication of the light-emitting element 30_2, the insulating structure 39_2 may be formed by partially etching a mask layer 390 via wet etching. As an insulating mask layer 410 is patterned along the patterns of a metal pattern layer 420, a mask layer 390 with an inclined side may be formed, and an undercut may be formed at a lower part of the mask layer 390, i.e., at part of the mask layer 390 directly on an electrode layer 37, by an etchant from wet etching. The insulating structure 39_2 may be disposed to expose part of the top surface of the electrode layer 37 and may have a different shape from the insulating structure 39 of FIG. 6 due to the presence of the undercut UC formed by wet etching.

For example, the insulating structure 39_2 may include a first portion 39A, which has a maximum width WC, and a second portion 39B, which has a smaller width than the first portion 39A and is disposed on the electrode layer 37. In the embodiment of FIG. 21, unlike in the embodiment of FIG. 6, the insulating structure 39_2 may have the maximum width WC not at the bottom surface thereof that is directly on the electrode layer 37, but at a part thereof that is a predetermined distance from the electrode layer 37. A side surface of the second portion 39B may be inwardly recessed from the lower part of the first portion 39A and may have a relatively small width due to the presence of the undercut UC formed by wet etching.

As the undercut UC is formed at the lower part of the insulating structure 39_2, the maximum width WC of the insulating structure 39_2 may be smaller than the maximum width WC of the insulating structure 39 of FIG. 6. The light-emitting element 30_2 may include the insulating structure 39_2, which includes the undercut UC formed during the wet-etching of mask layer 390. Even if the shape of the insulating structure 39_2 is changed, part of the top surface of the electrode layer 37 may be exposed, and one end portion of the light-emitting element 30_2 or the top surface of the electrode layer 37 may be in contact with one of contact electrodes (CNE1 and CNE2).

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation. Hence, the real protective scope of the invention shall be determined by the technical scope of the accompanying claims.

What is claimed is:

1. A micro-column light-emitting element comprising:
   a first semiconductor layer doped with an n-type dopant;
   a second semiconductor layer doped with a p-type dopant;
   a light-emitting layer disposed between the first semiconductor layer and the second semiconductor layer;
   an electrode layer disposed on the second semiconductor layer;
   an insulating structure disposed on the electrode layer and having a maximum diameter smaller than a diameter of the electrode layer; and
   an insulating film that surrounds side surfaces of the first semiconductor layer, the light-emitting layer, and the second semiconductor layer.

2. The light-emitting element of claim 1, wherein the insulating structure includes:
   a bottom surface that contacts the electrode layer; and
   an inclined side surface that is inclined with respect to the bottom surface,
   wherein a diameter of the insulating structure decreases from the bottom surface to a top of the insulating structure.

3. The light-emitting element of claim 2, wherein a height of the insulating structure is in a range of about 500 nm to about 1 μm.

4. The light-emitting element of claim 2, wherein a maximum diameter of the insulating structure is in a range of about 100 nm to about 500 nm.

5. The light-emitting element of claim 2, wherein
   the insulating structure includes at least one of silicon oxide, silicon nitride, and silicon oxynitride, and
   the insulating film is a single layer or a multilayer including at least one of silicon oxide, silicon nitride, silicon oxynitride, aluminum nitride, aluminum oxide, titanium oxide, zirconium oxide, and hafnium oxide.

6. The light-emitting element of claim 5, wherein a thickness of the insulating film is in a range of about 10 nm to about 200 nm.

7. The light-emitting element of claim 2, further comprising:
   a third semiconductor layer disposed between the first semiconductor layer and the light-emitting layer;
   a fourth semiconductor layer disposed between the second semiconductor layer and the light-emitting layer; and
   a fifth semiconductor layer disposed between the second and fourth semiconductor layers,
   wherein the insulating film surrounds side surfaces of the third, fourth, and fifth semiconductor layers.

8. The light-emitting element of claim 1, wherein the insulating structure includes:
   a first portion having a maximum width of the insulating structure, the first portion including a side surface that is inclined, and
   a second portion connected to a lower part of the first portion and having a smaller width than the maximum width of the insulating structure.

9. A display device comprising:
   a first substrate;
   a first electrode disposed on the first substrate;
   a second electrode spaced apart from the first electrode;
   a first insulating layer disposed on the first substrate and covering the first electrode and the second electrode;
   a plurality of micro-column light-emitting elements disposed on the first insulating layer and including end portions disposed on the first electrode and the second electrode;
   first contact electrode that electrically contacts the first electrode and first end portions of the plurality of micro-column light-emitting elements; and
   a second contact electrode that electrically contacts the second electrode and second end portions of the plurality of micro-column light-emitting elements,
   wherein each of the plurality of micro-column light-emitting elements includes:
     a first semiconductor layer doped with an n-type dopant;
     a second semiconductor layer doped with a p-type dopant;
     a light-emitting layer disposed between the first and second semiconductor layers;
     an electrode layer disposed on the second semiconductor layer;
     an insulating structure disposed on the electrode layer and having a maximum diameter smaller than a diameter of the electrode layer; and
     an insulating film that surrounds side surfaces of the first semiconductor layer, the light-emitting layer, and the second semiconductor layer.

10. The display device of claim 9, wherein
    the insulating structure includes a bottom surface and an inclined side surface, and a diameter of the insulating structure decreases from the bottom surface to a top of the insulating structure.

11. The display device of claim 10, wherein the insulating structure includes at least one of silicon oxide, silicon nitride, and silicon oxynitride.

12. The display device of claim 9, further comprising:
a first contact surface where the first contact electrode and a part of a top surface of the electrode layer contact each other;
a second contact surface where the first contact electrode and a part of a side surface of the insulating structure contact each other; and
a third contact surface where the second contact electrode and a bottom surface of the first semiconductor layer contact each other,
wherein the first contact surface is smaller than the third contact surface.

13. The display device of claim 12, wherein
a space is formed between the insulating structure of each of the plurality of light-emitting elements and the first insulating layer, and
the electrode layer includes a surface that adjoins the space and does not contact the first contact electrode.

\* \* \* \* \*